(12) United States Patent
Go

(10) Patent No.: US 7,275,877 B2
(45) Date of Patent: Oct. 2, 2007

(54) OPTICAL MODULE HAVING INDIVIDUAL HOUSING FOR AN OPTICAL PROCESSING UNIT AND AN OPTICAL SUB-ASSEMBLY

(75) Inventor: Hisao Go, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 18 days.

(21) Appl. No.: 10/834,043

(22) Filed: Apr. 29, 2004

(65) Prior Publication Data

US 2004/0264888 A1 Dec. 30, 2004

(30) Foreign Application Priority Data

Apr. 30, 2003 (JP) ............... 2003-125778

(51) Int. Cl.
*G02B 6/36* (2006.01)
(52) U.S. Cl. .................. 385/92; 385/88; 385/93
(58) Field of Classification Search ........ None
See application file for complete search history.

(56) References Cited

U.S. PATENT DOCUMENTS

| | | | | |
|---|---|---|---|---|
| 5,074,682 A | * | 12/1991 | Uno et al. ............. | 385/93 |
| 5,082,376 A | * | 1/1992 | Beylat et al. ........... | 385/3 |
| 5,293,441 A | * | 3/1994 | Tanisawa .............. | 385/92 |
| 5,552,918 A | | 9/1996 | Krug et al. | |
| 6,370,290 B1 | * | 4/2002 | Ball et al. ............. | 385/14 |
| 6,430,337 B1 | * | 8/2002 | Bergmann et al. ....... | 385/25 |
| 6,574,382 B2 | * | 6/2003 | Shekel ................ | 385/14 |
| 6,749,347 B1 | * | 6/2004 | Ichihara et al. ......... | 385/93 |
| 6,865,006 B2 | * | 3/2005 | Sakane et al. .......... | 359/251 |
| 2004/0218857 A1 | * | 11/2004 | Hung ................. | 385/31 |

FOREIGN PATENT DOCUMENTS

| | | |
|---|---|---|
| EP | 1 329 753 A1 | 7/2003 |
| JP | 05-297233 | 11/1993 |
| JP | 11-194238 | 7/1999 |
| JP | 11-295561 | 10/1999 |
| JP | 2000-028870 | 1/2000 |
| JP | 2002-182078 | 6/2002 |

OTHER PUBLICATIONS

K. Anderson, "Design and Manufacturability Issues of a Co-packaged DFB/MZ Module," Proceedings 49th Electronic Components & Technology Conference, Jun. 1-4, 1999, San Diego, California USA, pp. 197-200.

* cited by examiner

*Primary Examiner*—Sung Pak
(74) *Attorney, Agent, or Firm*—Venable LLP; Michael A. Sartori; Steven J. Schwarz

(57) ABSTRACT

The present invention provides an optical module in which an optical alignment between the light-emitting device and the waveguide device may be simplified. The optical module of the present invention has a waveguide device, first and second lenses, a housing and an optical sub-assembly (OSA) unit. Two lenses optically couple with respective end faces of the waveguide device. The housing encloses the waveguide device, and first and second lenses therein. The OSA unit has a package and a light-emitting device installed in the package. In the present invention, the OSA unit is aligned with the housing such that the light-emitting device is optically coupled with the waveguide device via the first lens.

15 Claims, 16 Drawing Sheets

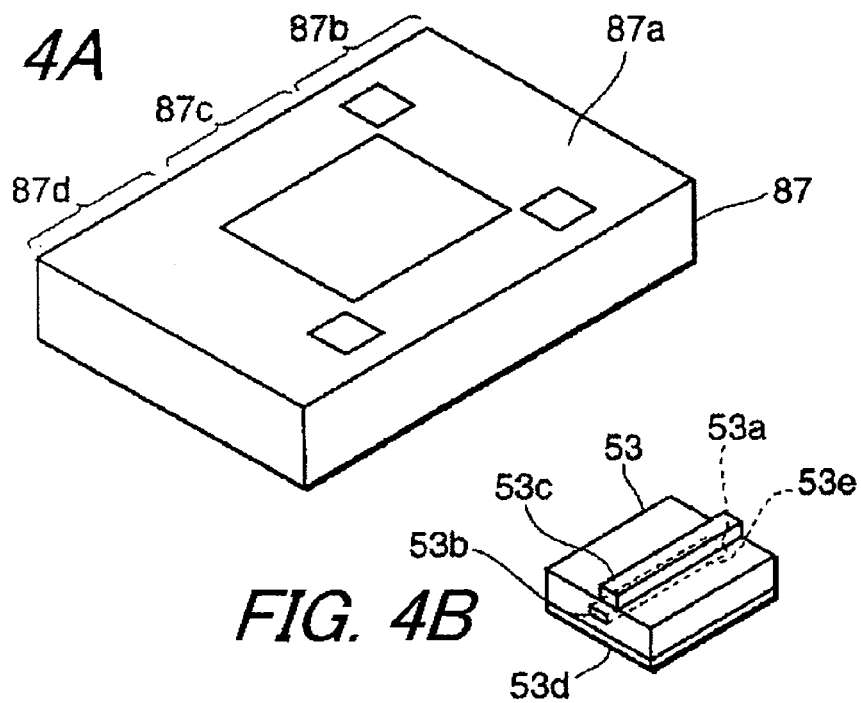
FIG. 4A
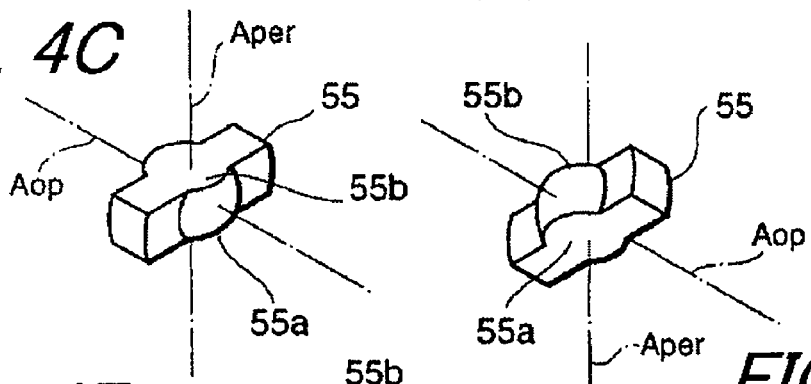
FIG. 4B
FIG. 4C
FIG. 4D
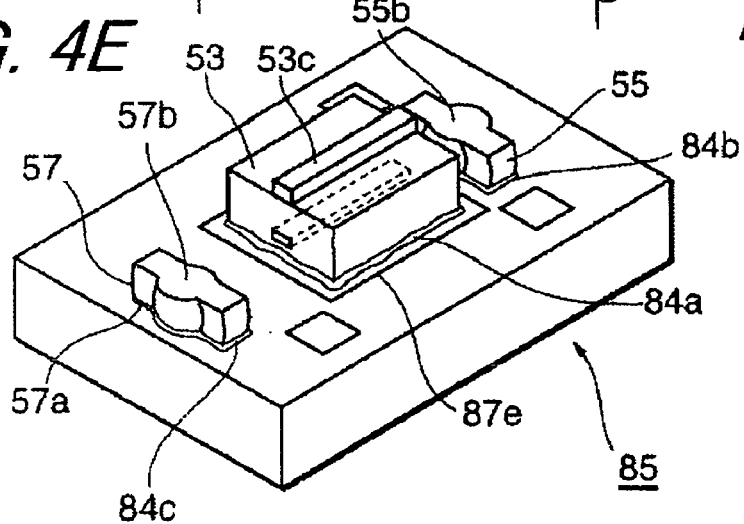
FIG. 4E

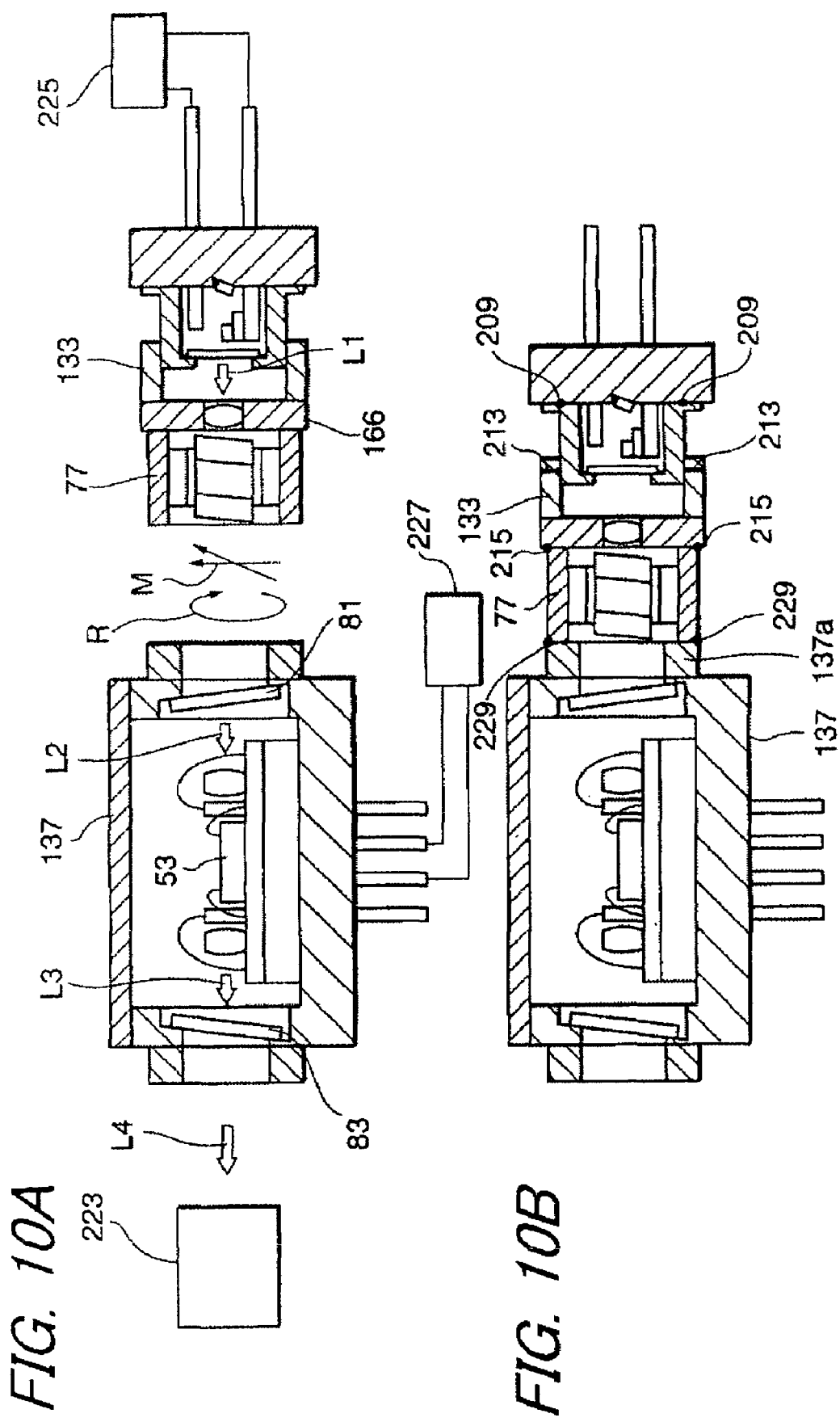

OPTICAL MODULE HAVING INDIVIDUAL HOUSING FOR AN OPTICAL PROCESSING UNIT AND AN OPTICAL SUB-ASSEMBLY

BACKGROUND OF THE INVENTION

1. Field of the Invention

The present invention relates to an optical module that provides individual housing for an optical processing unit and an optical sub-assembly.

2. Related Prior Art

It is known that, in an optical transmitting module, a laser diode (LD) is driven by a DC signal and an external modulator modulates un-modulated light emitted from the LD. Since the LD is driven by the DC signal, a spectral width of the emitted light becomes narrow, especially when using the DFB-LD (Distributed Feed-Back LD) and driving the DFB-LD by the DC signal, the spectral width thereof can be narrowed to scores of GHz. A Mach-Zehnder modulator is combined to such DFB-LD for modulating the light emitted from the DFB-LD.

According to FIG. 16, which is a schematic diagram showing a conventional module having the Mach-Zehnder device as an external modulator, the module 1 provides single housing 3, within which the LD 5 and the Mach-Zehnder device 7 is installed via a bench 9. Some additional components, such as lenses 15, 17, and 19, and an optical isolator 13, are also mounted on the bench 9. On the bench 9, the Mach-Zehnder device 7, the LD 5, lenses 15, 17, and 19, and the optical isolator 13 are optically aligned to each other.

In the optical module shown in FIG. 16, the optical alignment between the LD and the Mach-Zehnder device is carried out by lenses disposed therebetween. However, the alignment in a XZ-plane, namely in a plane parallel to the primary surface of the bench 9, is relatively simple compared to the rest direction Y. By sliding the lens on the bench 9, the alignment in the XZ-plane can be done. Nevertheless, for the direction Y, the alignment must be carried out to adjust the level of the optical axis of the lenses 15, 17, and 19. The adjustment of the level is done by the machining of the base of the lens after measuring the height of the optical axis of the LD 5 and the Mach-Zehnder device 7 from the bench 9. The adjustment by the machining must be performed for respective lenses. Thus, the alignment along the direction Y contains complex procedures.

The alignment accuracy of the conventional module 1 along the Y-direction of the lens is fully determined by the measurement of the level of the optical axis and the machining of the base. The critical accuracy is a few micron meters at least, which is insufficient for the module using the single mode fiber. Accordingly, additional lens 21 may be prepared on the edge of the optical isolator to optically couple the LD 5 to the Mach-Zehnder device 7 in effective.

Further, even in the alignment in the XZ-plane, the sliding of the lens is carried out by using a manipulator. Accordingly, a space for operating the manipulator must be prepared between the LD 5 and the isolator 13, and between the isolator 13 and the Mach-Zehnder device 7, which restricts to position the lens 17 close to the isolator 13.

SUMMARY OF THE INVENTION

Therefore, an object of the present invention is to provide an optical module, in which aforesaid subjects may be overcome. According to one aspect of the present invention, an optical module comprises a coupling unit, an optical processing unit and an optical sub-assembly unit. These units are arranged along an optical axis and are optically aligned to each other. The optical processing unit includes an optical processing device, such as an optical modulator, an optical amplifier, and a variable optical attenuator. The optical sub-assembly unit includes an optical sub-assembly (OSA), such as a transmitting optical sub-assembly (TOSA) and a receiving optical sub-assembly (ROSA), enclosing a semiconductor optical device.

The optical module of the present invention may further include a housing for the optical processing unit and a co-axial package for the OSA independent from the housing. The OSA unit may further include a first alignment member, while the coupling unit may include a second alignment member. The first optical alignment member aligns the OSA along the optical axis and aligns the optical processing unit with the OSA unit in a plane perpendicular to the optical axis. The second alignment member aligns the coupling unit along the optical axis and aligns the optical processing unit in the plane perpendicular to the optical axis.

Since the optical processing device in the optical processing unit and the semiconductor optical device in the OSA are provided in the individual package, and the optical alignment between two devices may be carried out by adjusting the position of respective housing in all directions, the procedure of the optical alignment can be simplified and the alignment accuracy between the devices can be enhanced.

In the optical module of the present invention, the OSA unit may further include an optical isolator disposed between the OSA and the optical processing unit. According to this configuration, since the optical isolator is disposed out of the housing of the optical processing unit and may be aligned in the plane perpendicular to the optical axis, the optical coupling efficiency between the optical isolator and the optical processing device can be enhanced.

The coupling unit may further include a receptacle sub-assembly or a pigtail type sub-assembly for optically coupling the present optical module to a transmission optical fiber. Since the receptacle sub-assembly or the pigtail type sub-assembly may optically align with the optical processing unit via the second alignment member, the coupling efficiency therebetween may be enhanced.

The optical processing unit may further include first and second lenses, an optical processing device, and a bench. The bench mounts the first and second lenses, and the optical processing device thereon. The optical processing device may be an optical modulator, an optical amplifier, and a variable optical attenuator. Since, in the present invention, the optical processing device in the optical processing unit aligns with the coupling unit and the OSA unit in an unit to unit mode, the optical coupling efficiency can be maintained even when the first and second lenses are disposed next to the optical processing device in the optical processing unit.

The bench in the optical processing unit may have recesses for positioning the first and second lenses, respectively. In this configuration, the alignment between the optical processing device and two lenses may be preformed passively.

The optical processing unit may further include a thermoelectric device for controlling temperatures of the optical processing device. In this configuration, the bench, on which the optical processing device and the lens are mounted, is installed on the thermoelectric device.

According to another aspect of the present invention, a method for manufacturing the optical module is provided. The optical module comprises a coupling unit, an optical processing unit, and an OSA unit. The optical processing unit includes a housing in which an optical processing device is installed. The OSA unit includes a package in which a semiconductor optical device is enclosed for coupling to the optical processing device in the optical processing unit. The coupling unit includes a receptacle sub-assembly or a pigtail type sub-assembly.

According to the present method, the OSA unit is aligned with the optical processing unit by iterating steps of aligning along the optical axis and in the plane perpendicular thereto until a predetermined optical coupling efficiency can be realized. Thus, the optical alignment between the optical processing unit and the OSA unit may be carried out in the unit to unit mode. The alignment between the coupling unit and the optical processing unit is preformed by the unit to unit base similar to the method between the optical processing unit and the OSA unit.

The OSA unit may include a first alignment member, while the coupling unit may include a second alignment member, and the alignment between the optical processing unit and the OSA unit may be carried out via the first alignment member, while the alignment between the coupling unit and the optical processing unit may be carried out via the second alignment member.

BRIEF DESCRIPTION OF DRAWINGS

FIG. 4A shows the bench installed in the optical processing unit, FIG. 4B shows an optical processing device with a waveguide for optical processing, FIG. 4C and FIG. 4D show an arrangement of the lens mounted on the bench, and FIG. 4E shows an waveguide assembly;

Figure 9A:
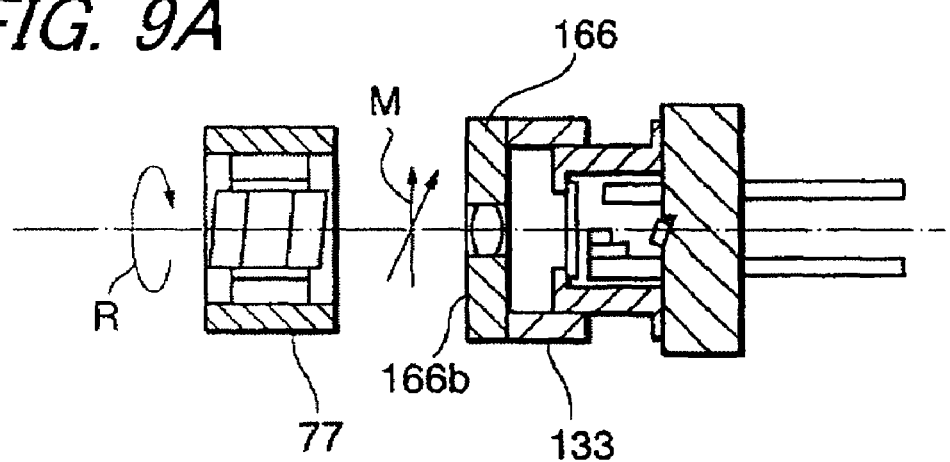
Figure 9B:
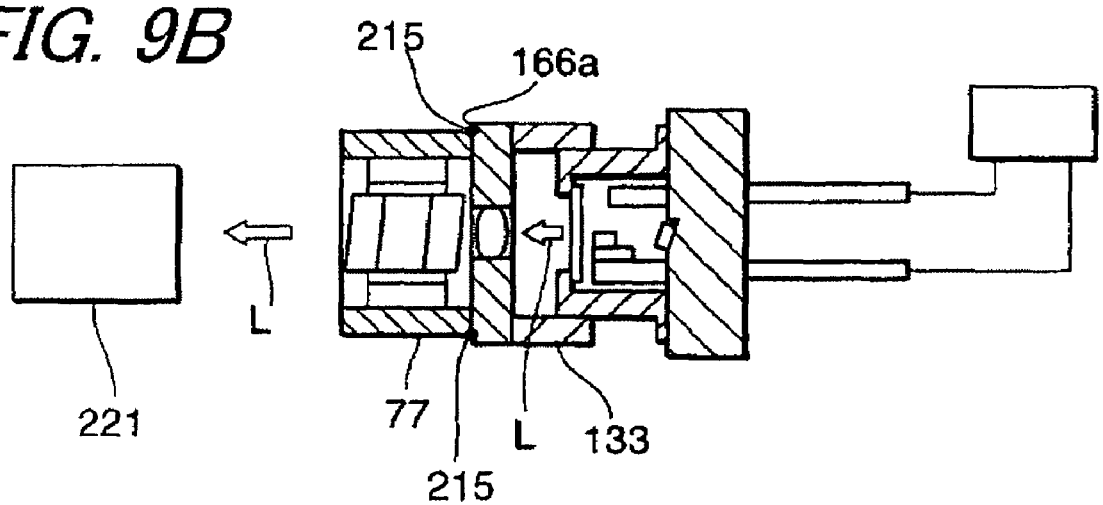
Figures 11A, 11B:
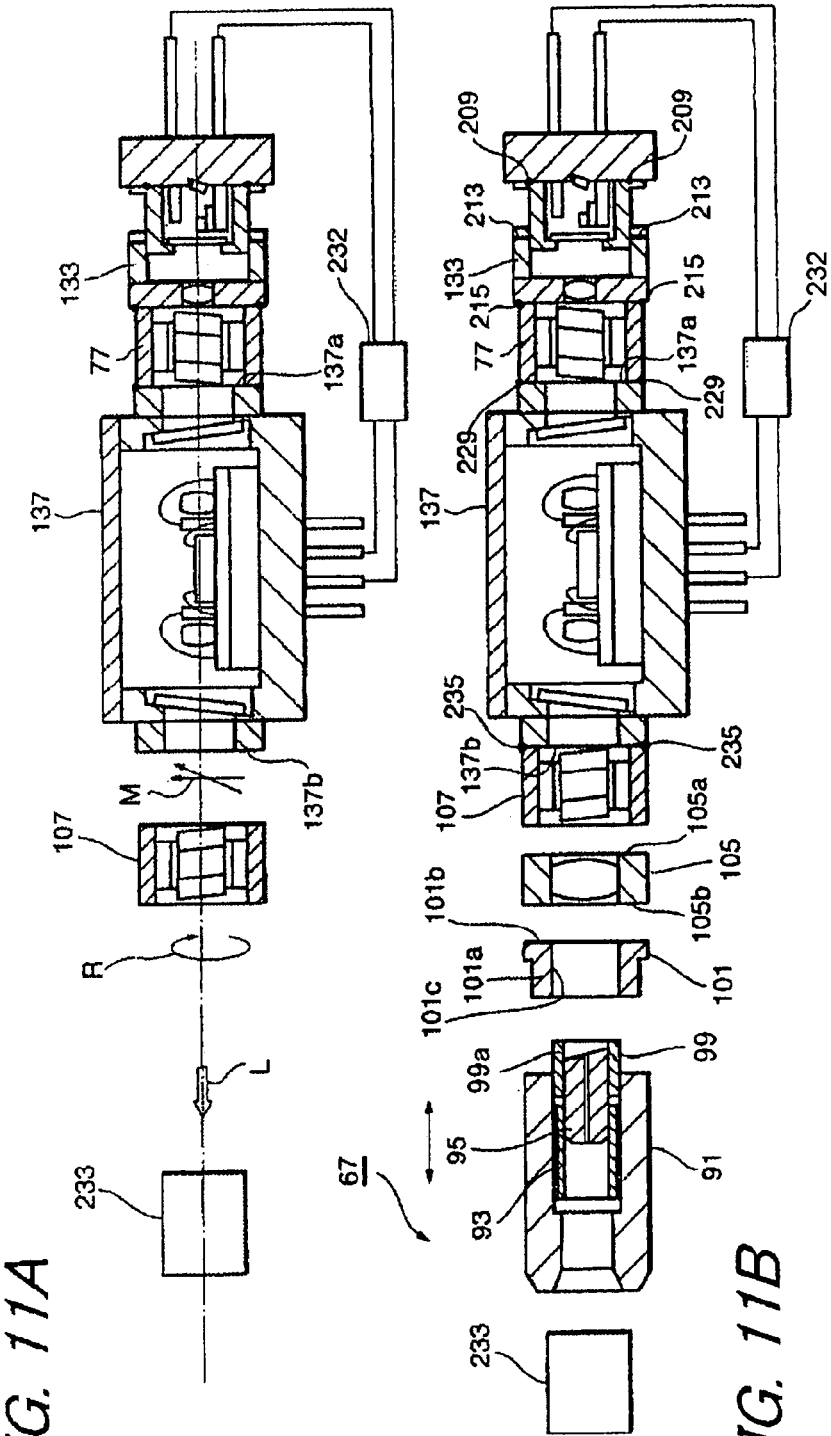
Figure 12:
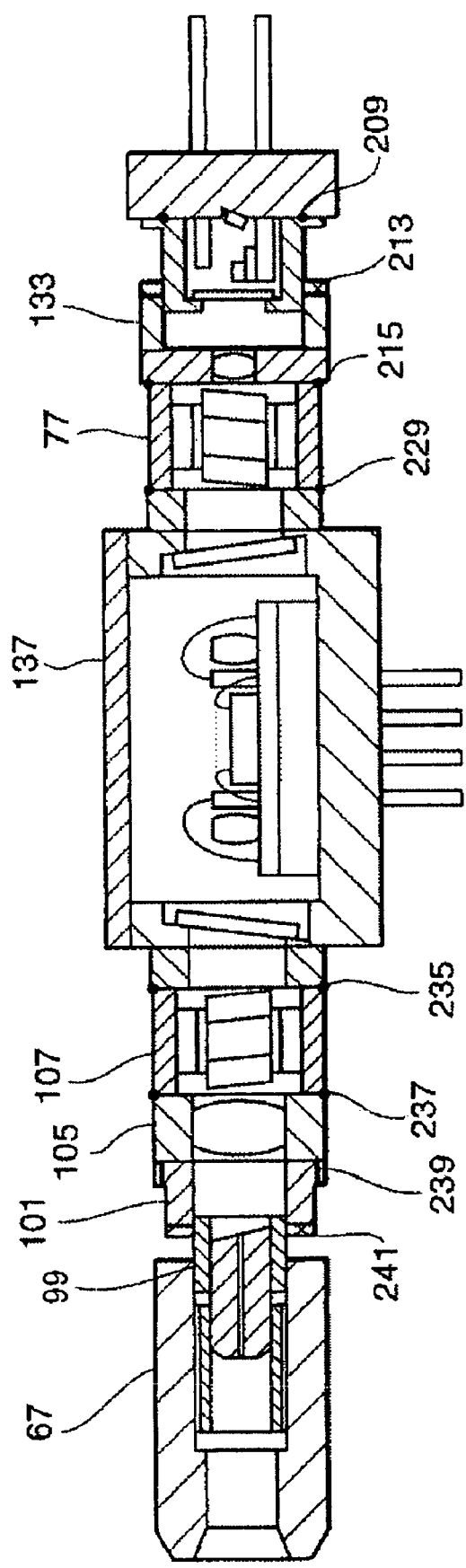
Figure 13:
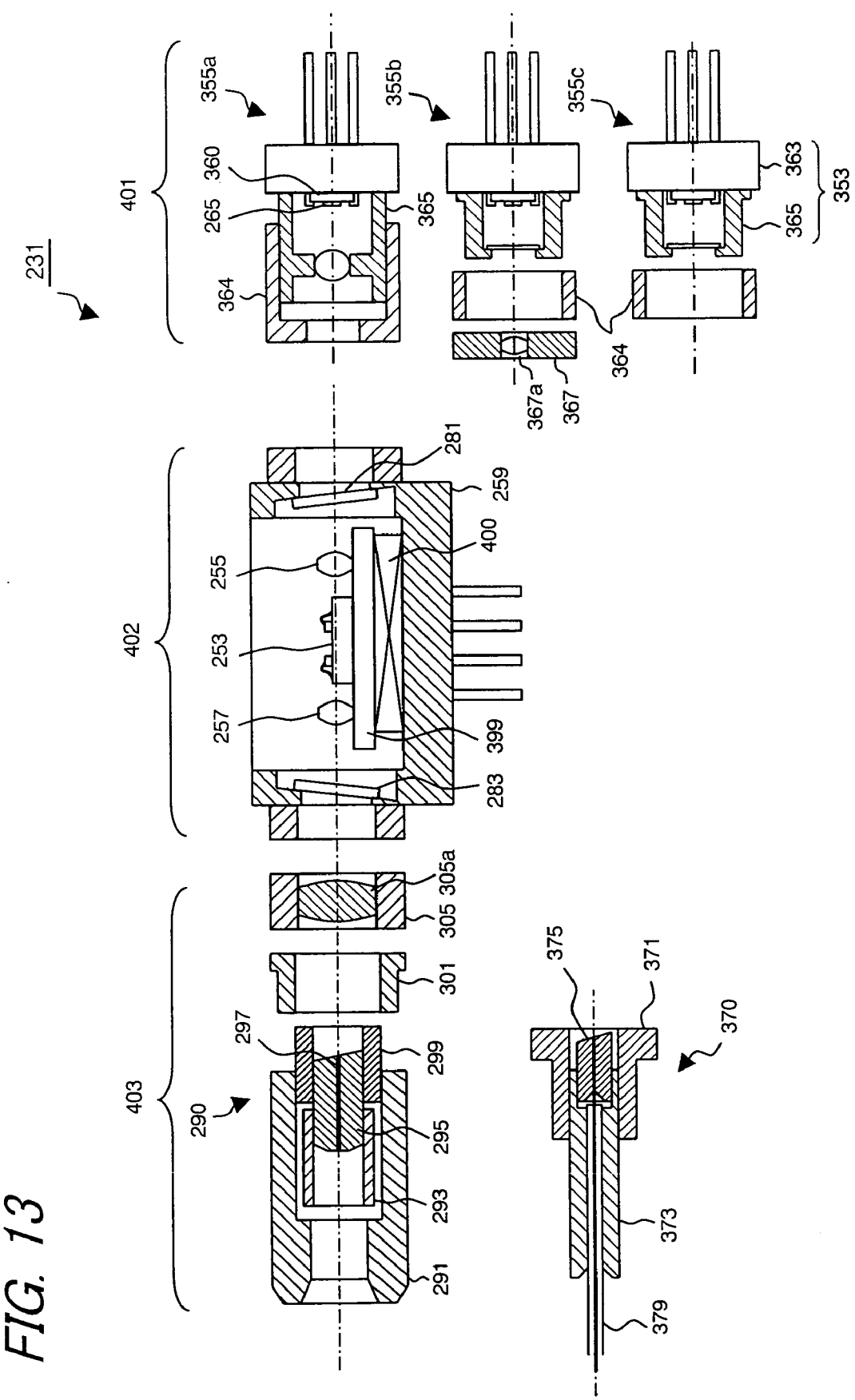
Figure 14:
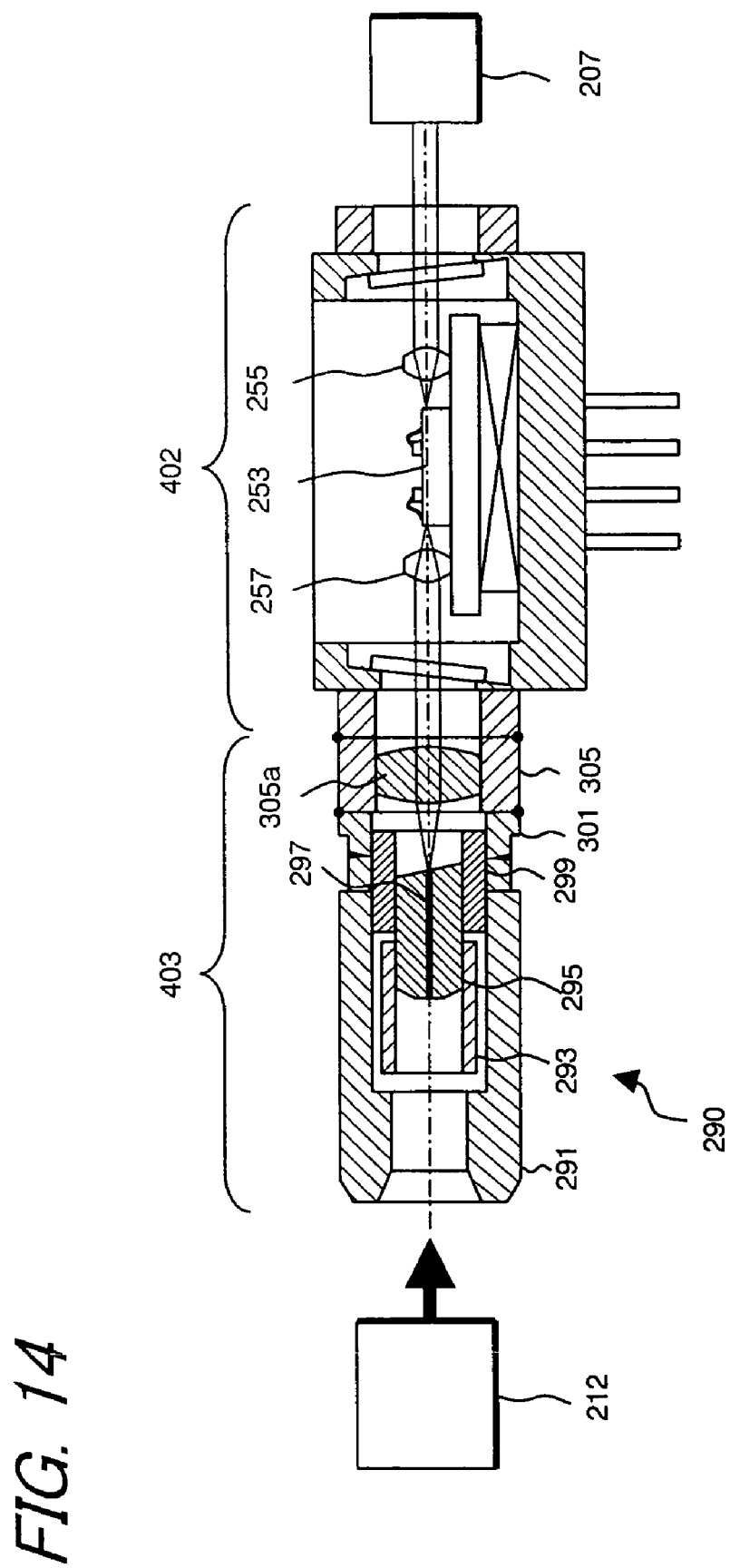
Figure 15:
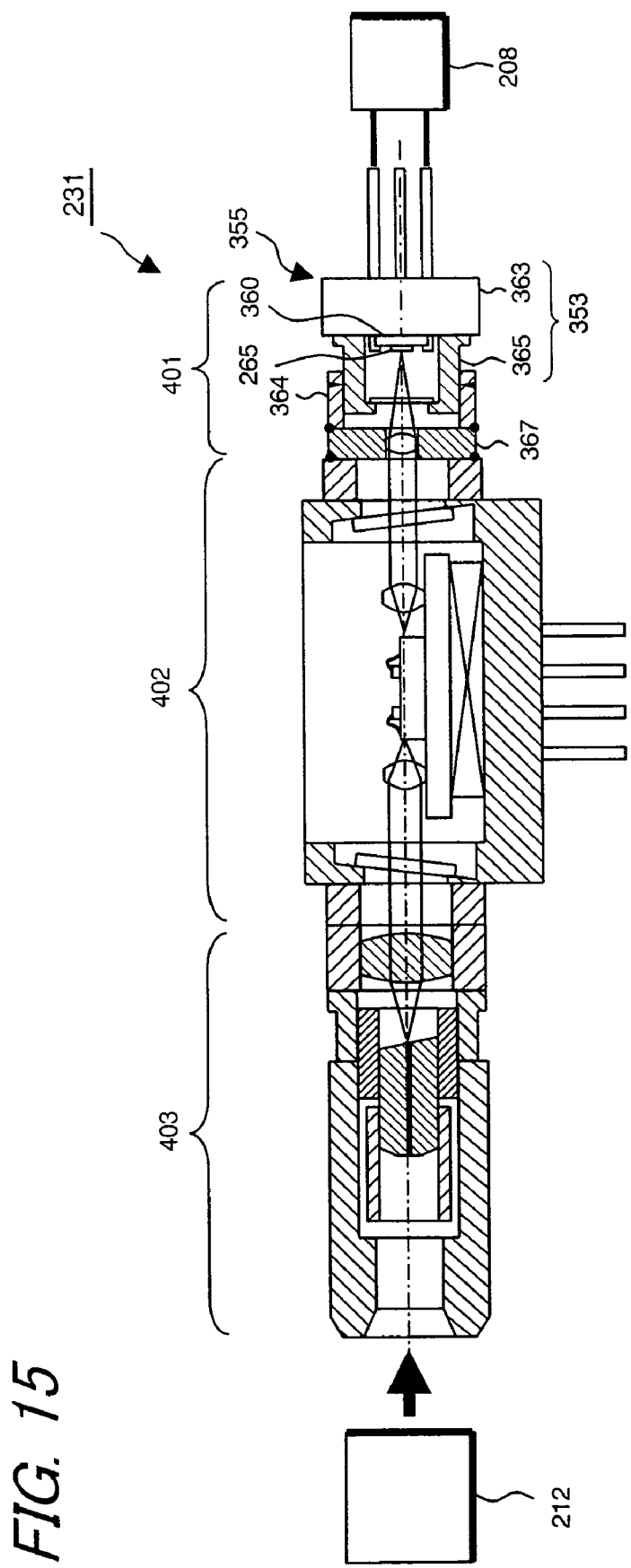
Figure 16:
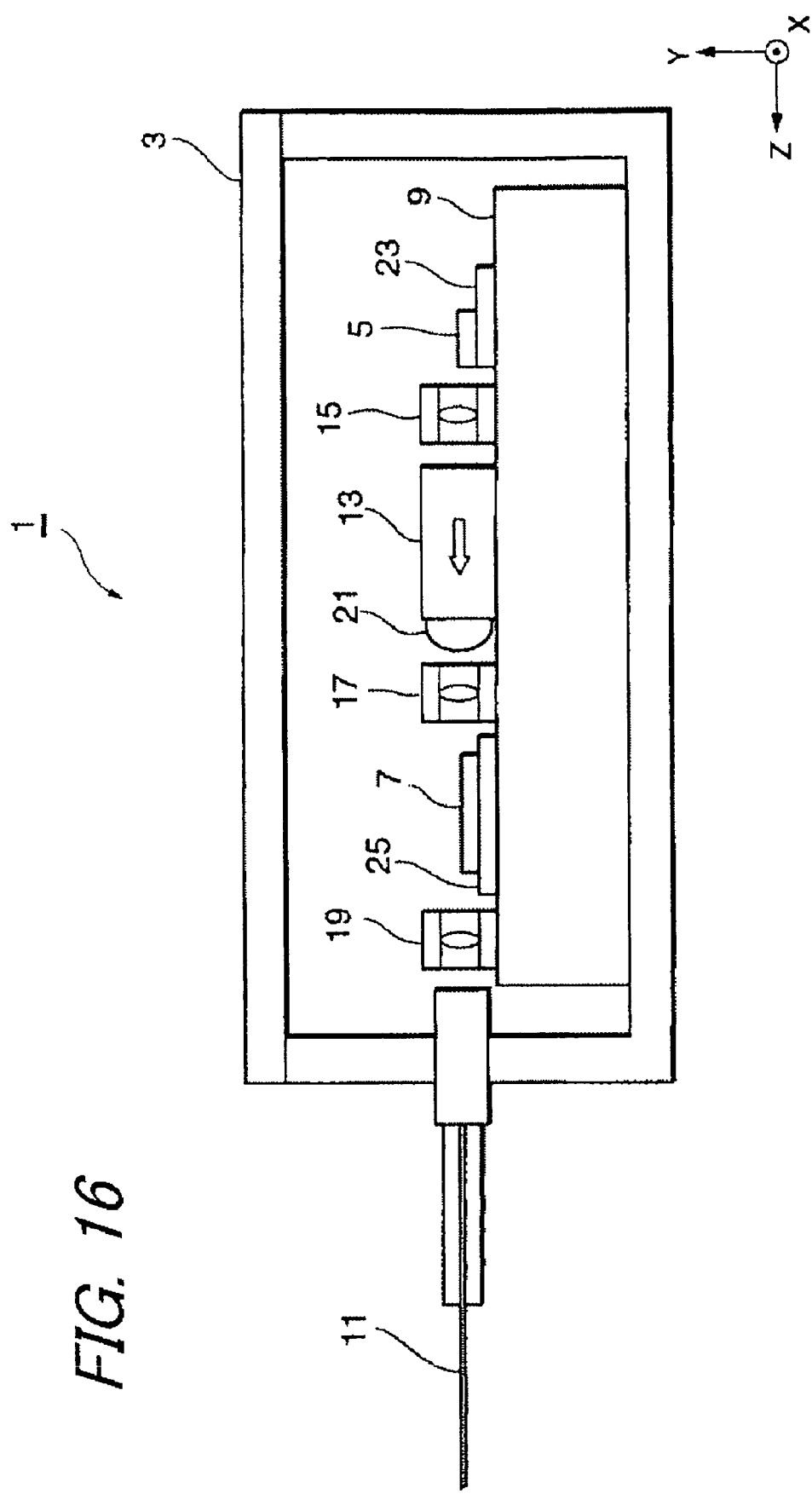

From FIG. 7A to FIG. 7D show manufacturing steps for the optical processing unit of the present invention;

Form FIG. 8A to FIG. 8D show manufacturing steps for the OSA unit;

FIG. 9A and FIG. 9B show manufacturing steps for installing the optical isolator in the OSA;

FIG. 10A and FIG. 10B show manufacturing steps for aligning the optical processing unit with the OSA unit;

FIG. 11A shows the step for aligning another optical isolator with the optical processing unit, and FIG. 11B show the step for aligning the coupling unit with the optical processing unit;

FIG. 12 is a schematic cross sectional view showing the completed optical module;

FIG. 13 is a schematic exploded view showing the optical module according to the fourth embodiment of the present invention;

FIG. 14 shows the manufacturing step for aligning the coupling unit and the optical processing unit;

FIG. 15 shows the step for aligning the optical processing unit and the OSA unit; and FIG. 16 shows a conventional optical module.

DETAILED DESCRIPTION OF PREFERRED EMBODIMENTS

Next, preferred embodiments of the present invention will be described as referring to accompanying drawings. In the description, the same elements will be refereed as the same symbols or the same numerals without overlapping explanations.

First Embodiment

Figure 1:
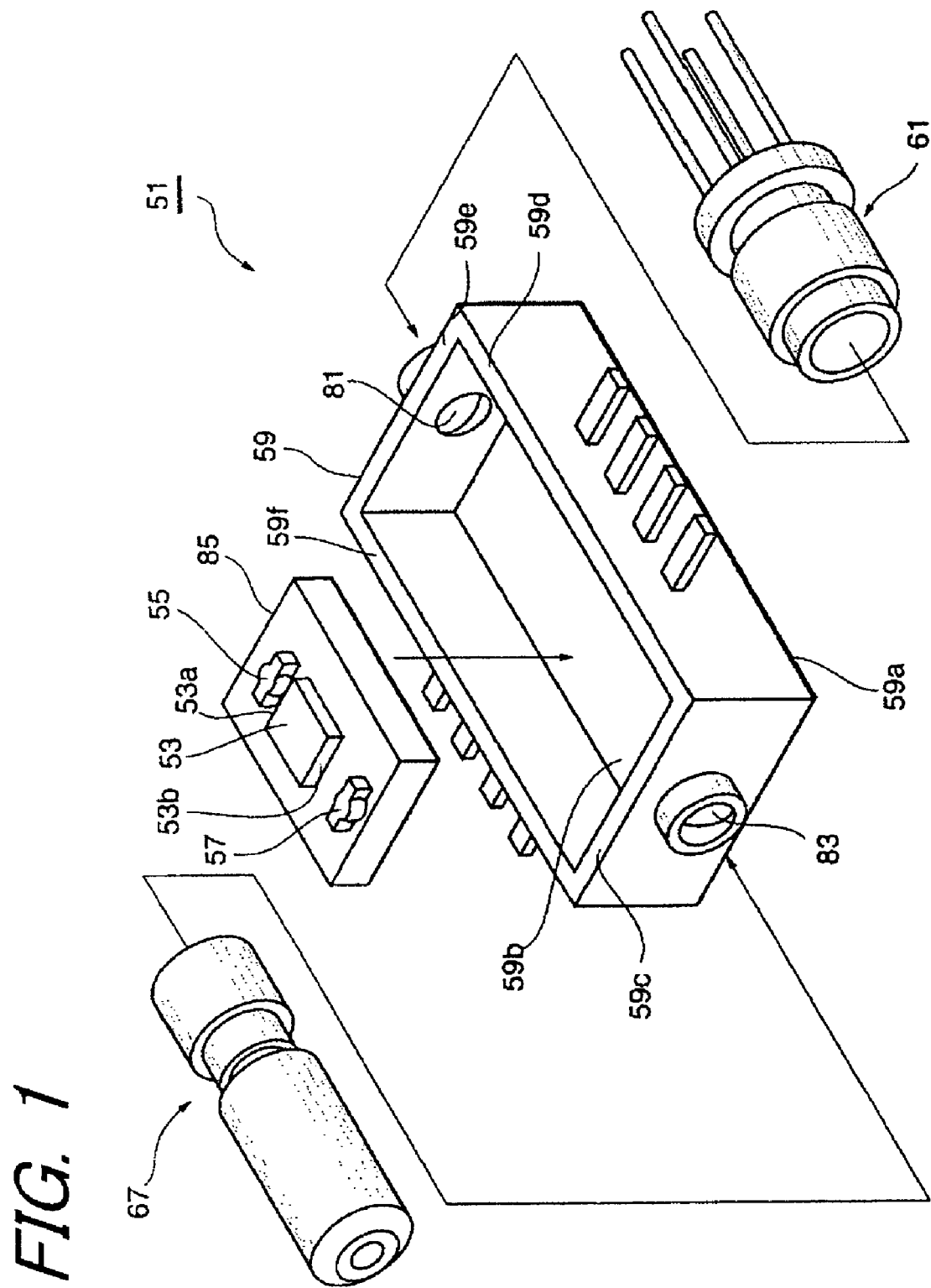
FIG. 1 is an exploded view shown a first embodiment of the present invention.
Figure 2:
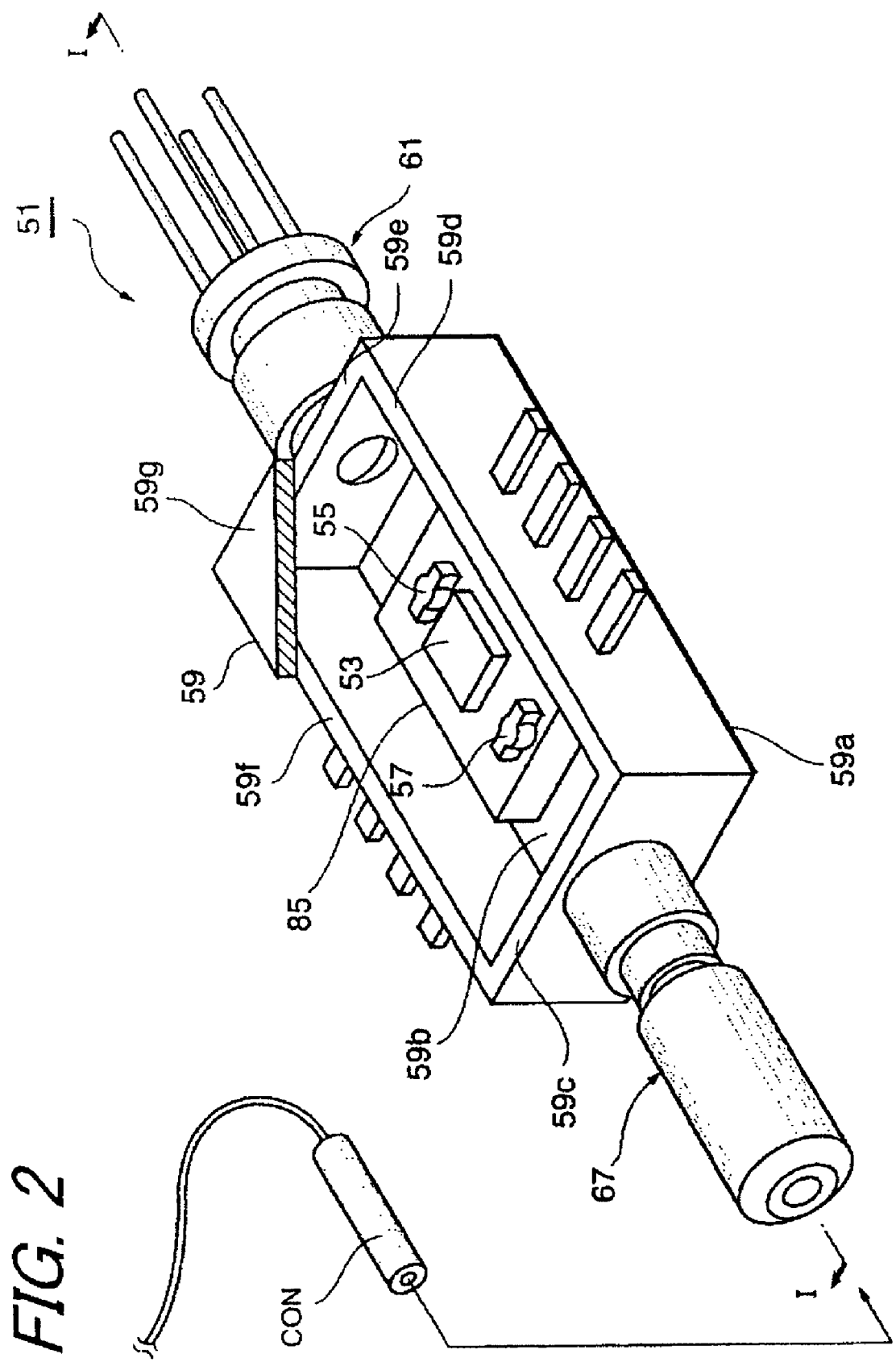
FIG. 2 is a partially cutaway view showing the optical module according to the first embodiment.
Figure 3:
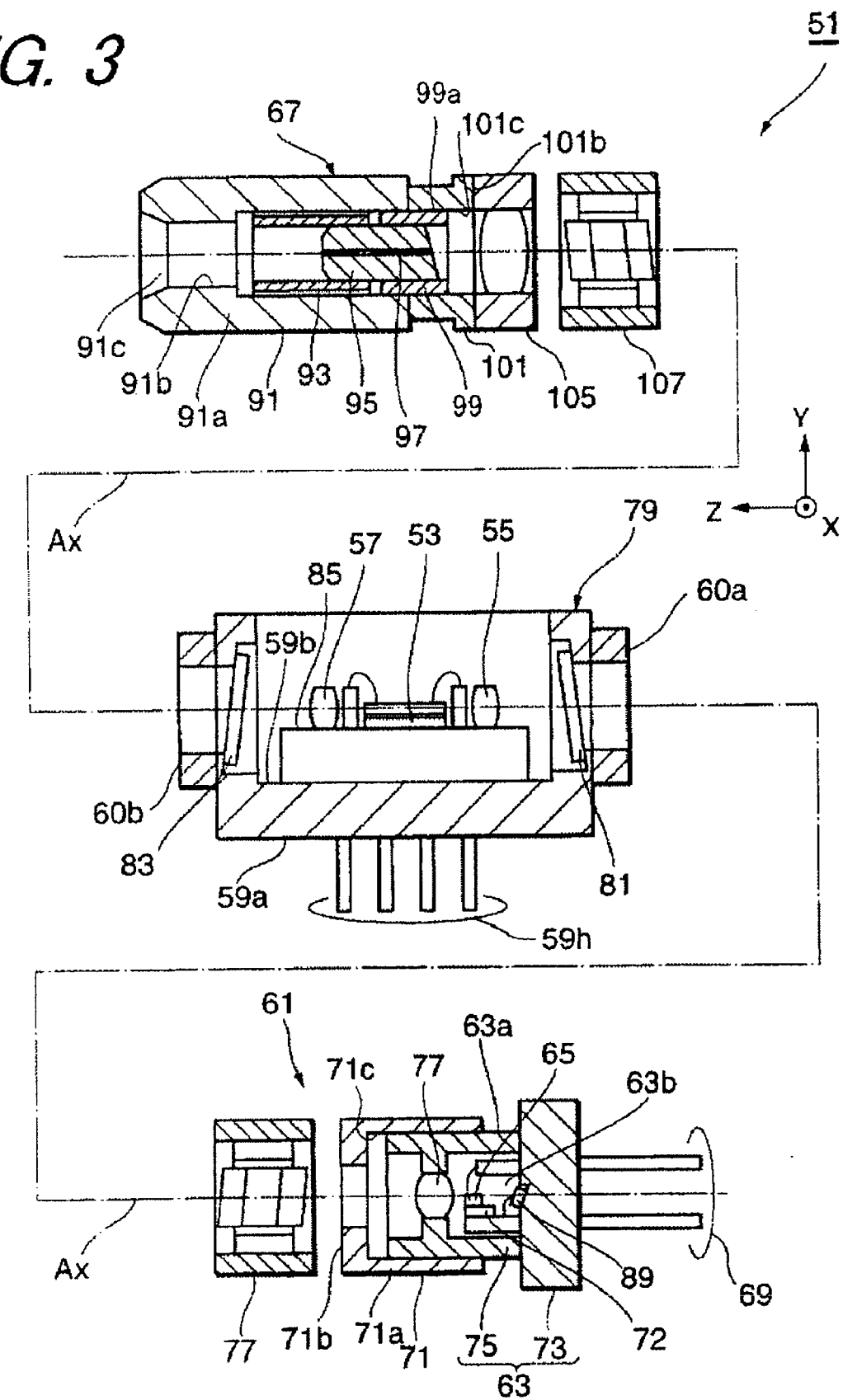
FIG. 3 is a schematic cross sectional view taken along the line I-I in FIG. 2.

FIG. 1 is an exploded view of the optical module 51 according to the first embodiment of the present invention, FIG. 2 is a partially cutaway of the optical module 51 to describe the inside thereof, and FIG. 3 is a schematic exploded and cross sectional view taken along the line I-I in FIG. 2.

The optical module 51 comprises the OSA unit 61, the optical processing unit 79 and the coupling unit 67. The optical processing unit 79 includes a waveguide device 53, first and second lenses 55 and 57, and a housing 59. The housing 59 encloses the waveguide device 53, and first and second lenses 55 and 57 therein. In the present embodiment, the coupling unit 67 is a type of the receptacle assembly. The first lens 55 optically couples with a first end face 53a of the waveguide device 53, while the second lens 57 couples with the second end face 53b of the waveguide device 53. Thus, the first lens 55 provides the light from the OSA unit 61 to the first end face 53a, and the second lens 57 provides the light from the waveguide device 53 to the coupling unit 67.

Referring to FIG. 3, the OSA unit 61 is a type of the transmitting optical sub-assembly (TOSA), and includes the co-axial type package 63, the alignment member 71 and the optical isolator 77. The package 63 comprises a stem 73 and a cover 75. A semiconductor light-emitting device 65, typically a semiconductor laser diode, is mounted on a stem 73 via a heat sink 72. That is, the semiconductor light-emitting device 65 is mounted on the stem 73 and enclosed in a cavity formed by the stem 73 and cover 75. The cover 75 may includes a lens 77. The OSA unit 61 thus configured is aligned with the optical processing unit 79 such that the light-emitting device 65 optically couples with the first lens 55. To do so, either the housing 59 of the optical processing unit 79 or the OSA unit 61 has a function to slide along three directions relative to each other.

As shown in FIG. 3, the OSA unit 61 further provides the alignment member 71 for the optical aligning to the optical processing unit 79. The cover 75 of the package 63 has an outer surface 63a extending along the optical axis Ax, while the alignment member 71 provides a side portion 71a with an inner surface 71c thereof also extending along the optical axis Ax. By sliding the inner surface 71c on the outer surface 63a, the optical alignment along the optical axis Ax can be carried out between the OSA unit 61 and the housing 59.

The alignment member 71 also provides an end surface 71b extending in the XY-plane intersecting the optical axis Ax. By sliding the housing 59, the end face 60a of the housing 59, on the end face 71b of the alignment member 71, the optical alignment in the XY-plane can be carried out between the housing 59 and the package 63. Thus, the optical alignment in all directions X, Y, and Z can be performed between the OSA unit 61 and the optical processing unit 79. Accordingly, the light-emitting device 65 in the OSA unit 61 can be aligned with the waveguide device 53 in the optical processing unit 79 via the first lens 55 in the housing 59, and the lens 77 provided in the cover 75.

The OSA unit 61 may further include a semiconductor light-receiving device 89 for monitoring light emitted from the light-emitting device 65. In the present embodiment, the light-receiving device 89 is mounted on the stem 73 so as to receive light emitted from the rear facet of the light-emitting device 65 which is opposite to the front facet directed to the optical processing unit 79. The light-receiving device 89 generates a photocurrent corresponding to the magnitude of the light emitted from the light-emitting device 65. The OSA unit 61 further provides a plurality of lead pins 69 extending from the stem 73, the light-emitting and light-receiving devices 69, 89 are connected thereto.

In the present embodiment, an optical isolator 79 is disposed between the alignment member 71 and the optical processing unit 79. The isolator 77 is optically aligned with the housing 59 of the optical processing unit 79, and the alignment member 71 is slidable on the end face of the isolator 79, instead of aforesaid description that the alignment member 71 is slid on the end face of the housing 59.

Next, an optical processing unit 79 will be described as referring to FIG. 2 and FIG. 3. The optical processing unit 79 includes the waveguide device 53, the first and second lenses 55, 57, and the housing 59. The housing 59 has a box type configuration, namely it comprises a bottom 59a with a mounting surface 59b on which the waveguide sub-assembly 85 is installed, four sides 59c to 59f, and a ceiling 59g. The housing also provides first and second windows 81, 83. The waveguide sub-assembly 85 that includes the waveguide device 53, and first and second lenses 55 and 57, receives light emitted from the OSA unit 61 via the first window 81, and provides light to the coupling unit 67 via the second window 83. Thus, the first window 81, the waveguide sub-assembly 85 and the second window 83 are arranged in a line along the optical axis Ax.

From FIG. 4A to FIG. 4D show the waveguide sub-assembly 85. FIG. 4A shows a bench 87. The bench 87 has a primary surface 87a comprising first to third areas 87b to 87d along the optical axis Ax. The first area 87b is provided for the first lens 55, the first area 87b has an identification by which the first lens is aligned. The second area 87c is provided for the waveguide device 53, while the third area 87d is for the second lens 57. The bench 87 is made of, for example, aluminum oxide or aluminum nitride, or alternately the bench 87 is made of silicon having an oxide layer thereon.

FIG. 4B shows the waveguide device 53. The waveguide device 53 comprises first and second end faces 53a and 53b, first and second electrodes 53c and 53d, and a waveguide 53e formed between two electrodes 53 and 53d. The first electrode 53c is provided on the primary surface of the waveguide device 53, while the second electrode 53d is formed on the other surface thereof. In the present embodiment, the waveguide device 53 modulates the light propagating within the waveguide 53e in accordance with a signal applied between two electrodes 53c and 53d. The wave guide device 53 may be an optical modulator that uses the electro-absorption or the Mach-Zehnder effects. In other embodiment described later, a variable optical attenuator and a semiconductor optical amplifier are used as the waveguide device, in which modulated light enters the waveguide device.

FIG. 4C and FIG. 4D show the lens 55. Although the description hereinbelow will be referred to the first lens 55, the same description may be applied to the second lens 57. The lens 55 has a bottom plane 55a, which is provided for the placement on the primary surface 87a of the bench 87, and an upper plane 55b. Both planes 55a and 55b are extending in parallel to the optical axis Aop thereof. In the present embodiment, the lens 55 may be an aspheric lens.

FIG. 4E is a perspective view of the waveguide sub-assembly 85. On the second area 87c of the bench 87 is formed a die pad 87e where the waveguide device 53 is mounted thereon. The lens 55 is mounted on the bench 87 as the bottom plane 55a thereof faces the primary surface 87a. The upper plane 55b of the lens 55 is for suctioning the lens 55 by the assembly apparatus, which is not shown in the figure, when sliding on the primary surface 87a. The waveguide device 53, and the first and second lenses 55 and 57 are fixed on the bench 87 with adhesive members 84a to 84c after optically aligning with respective to each other.

Referring to FIG. 3 again, the coupling unit 67 of the present embodiment includes a receptacle sub-assembly, another alignment member 101, a lens holder 105, and an optical isolator 107. The receptacle sub-assembly comprises a sleeve cover 91, a split sleeve 93, a stub 95, a coupling fiber 97, and a bush 99. The sleeve cover 91 is a tubular member that has an opening 91c in one end and a side portion 91a having an inner surface 91b. The ferrule, which is denoted as CON in FIG. 2, is inserted from the opening 91c and secured in the inner surface 91b. The stub 95 defines the position of the tip of the ferrule in the split sleeve 93. A rigid sleeve may be applicable instead of the split sleeve 93. The stub 95 provides the coupling fiber 97 in the center thereof. The bush 99 is disposed and press-fitted between the side portion 91a of the sleeve cover 91 and the stub 95.

The sleeve cover 91 may slide with respect to the alignment member 101 along the optical axis Ax via the bush 99. Further, the housing 59 and the coupling unit 67 may be aligned in a plane intersecting the axis Ax. In detail, the alignment member 101, which is a tubular member having a side portion 101a with an inner surface 101c thereof, may slide on the outer surface of the bush 99, thereby positioning the coupling unit 67 along the optical axis Ax with respect to the optical processing unit 79. The alignment member 101 further provides a sliding surface 101b in one end thereof extending in the XY-plane for sliding the end face 60b of the housing 59 thereon, thereby aligning the coupling unit 67 with respect to the optical processing unit 79 in the XY-plane. Thus, the alignment member 101 enables to align the coupling unit 67 in three directions X, Y, and Z with respect to the optical processing unit 79.

In the embodiment shown in FIG. 3, a lens holder 105, which holds another lens, is disposed between the coupling unit 67 and the optical processing unit 79. Accordingly, the coupling fiber 97 in the stub 95 may be optically coupled with the waveguide device 53 in the optical processing unit 79 via the second lens 57 and the other lens secured in the lens holder 107. The optical module 51 may further provide an optical isolator 107 between the lens holder 105 and the optical processing unit 79 to prevent light from reflecting back to the waveguide device 53.

The first and second windows 81, 83 airtightly seal the housing 59 of the optical processing unit 79, and the package 63 of the OSA unit 61 also airtightly seals the semiconductor light-emitting device 65. Thus, in the present invention, the devices, the semiconductor light-emitting device 65 and the light-receiving device 89, and the waveguide device 53, may be independently sealed in air-tight but the optical alignment with respect to each other may be performed without difficulty.

Figure 5A:
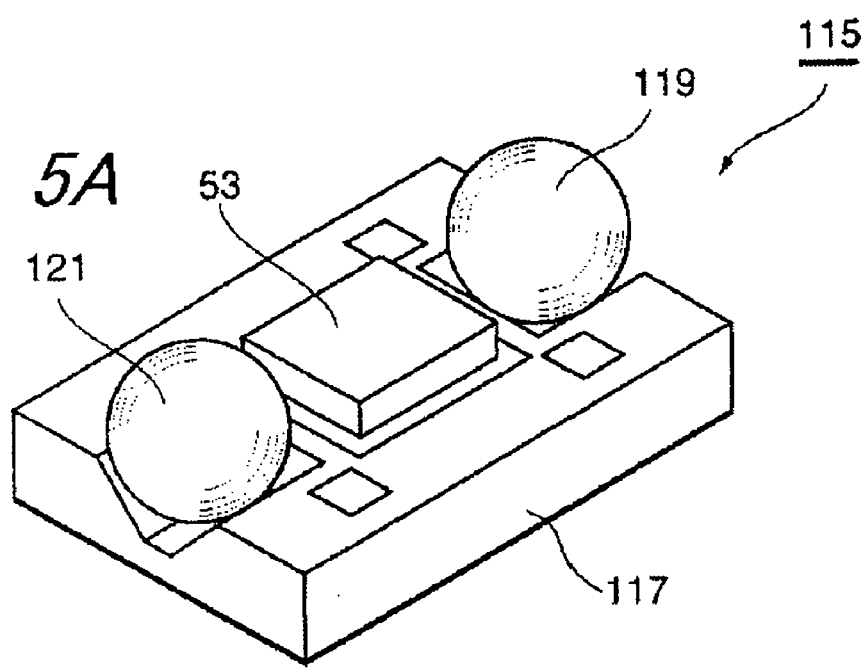
FIG. 5A shows a modified arrangement of the waveguide assembly.
Figure 5B:
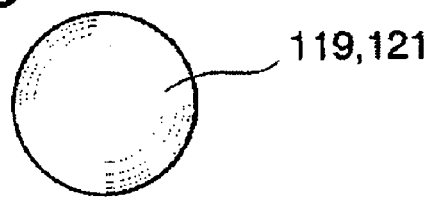
FIG. 5B shows a modified lens.
Figure 5C:
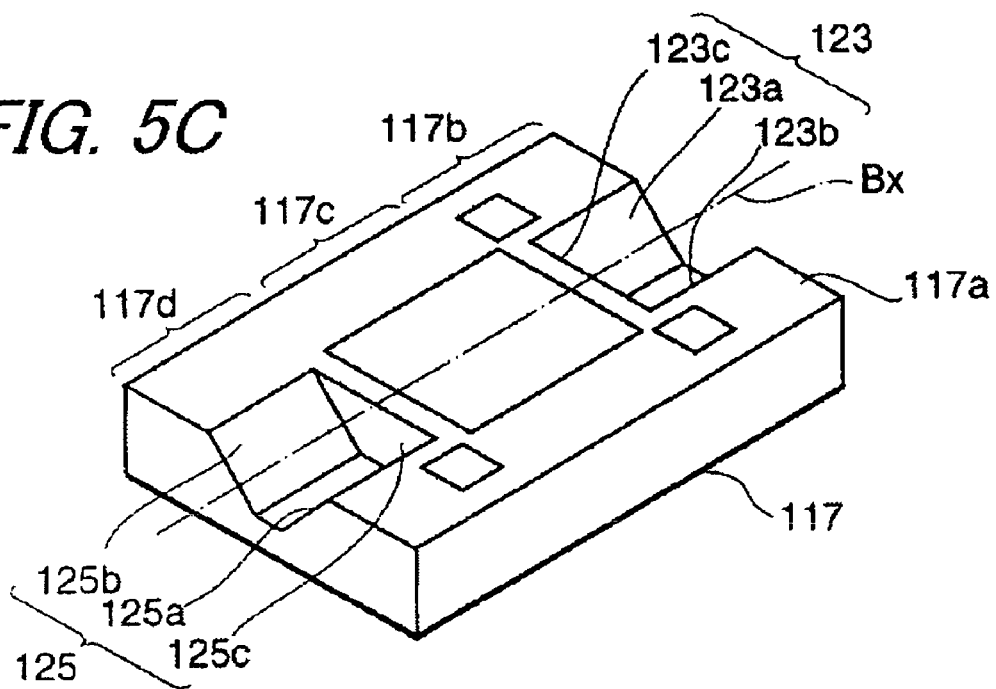
FIG. 5C shows another type of the bench.

FIG. 5A shows a modified waveguide sub-assembly 115, and FIG. 5B and FIG. 5C show another form of lens and the bench, respectively. In FIG. 5B, though the first and second lenses 119 and 121 of the modified example are spherical lenses, an aspherical lens similar to the aforesaid embodiment, a rod lens, and a selfoc lens™ may be applicable.

The bench 117 shown in FIG. 5C has a first recess 123 extending along the line Bx for positioning the first lens 119. The first recess 123 has side surfaces 123a to 123c, which the surface of the first lens 123 is in contact thereto. The third area 117d of the bench 117 also provides the second recess 125 for positioning the second lens 121. The second recess 125 also has side surfaces 125a to 125c, which the surface of the second lens 119 is in contact. The first and second lenses 119, 121 are permanently fixed to the bench with adhesive. The bench 115 with a modified form may be made of silicon, two recesses are formed by an ordinal process for the semiconductor device, for example, using a photolithography and an etching with an etchant containing fluoric acid.

In the present embodiment, though the coupling unit 67 is described with the configuration of the optical receptacle sub-assembly, another configuration, for example a pig-tailed type sub-assembly, may be provided in stead of the receptacle sub-assembly.

Second Embodiment

Figure 6:
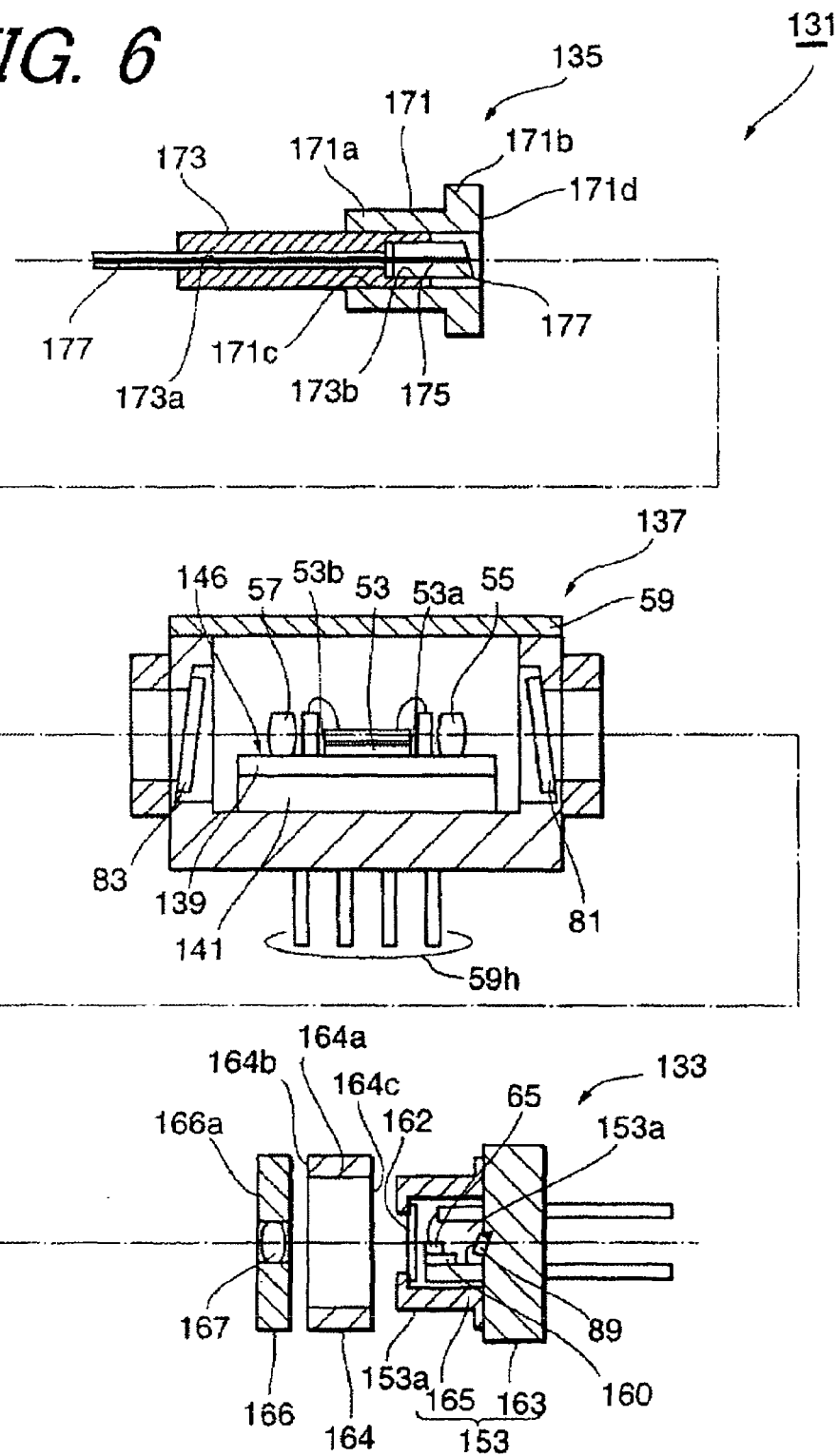
FIG. 6 is a schematic cross sectional view taken along the line I-I in FIG. 2 of the second embodiment of the present invention.

Next, the optical module 131 having the coupling unit 135 of a pig-tailed type configuration will be explained. FIG. 6 is a cross sectional exploded view of the optical module 131.

According to the present embodiment, the optical processing unit 137 includes the bench 139, on which the waveguide device 53, and two lenses 55 and 57 F are mounted, is placed on the thermoelectric device 141, typically a Peltier device. The thermoelectric device 141 adjusts the temperature of the waveguide device 53 to maintain the modulation efficiency. The thermoelectric device 141 is electrically connected to lead pin 59 provided in the housing 59.

The configuration of the OSA unit 133 is modified from those of the first embodiment shown in FIG. 3. The OSA unit 133 provides the stem 163 and the cover 165. The cover includes a window 172 instead of the optical lens 77 in the first embodiment. The optical lens 167, which is secured in the lens holder 166, of the present OSA unit 133 is disposed outside the package 153. To align the light-emitting device 65 in the package 153 with the waveguide device 53 in the optical processing unit 137, the lens holder 166 may be positioned independently of the cover 165. Namely, the lens holder 166 is slidable on the surface 164b of the alignment member 164 in the XY-plane intersecting the optical axis Ax, and fixed not only to the alignment member 164 but also to the housing 59. The alignment member 164 is also slidable on the outer surface 153a of the cover 153 along the optical axis Ax. Thus, the light-emitting device 65 in the OSA unit 133 and the waveguide device 53 in the optical processing unit 137 can be optically coupled.

The OSA unit 133 may provide the optical isolator between the optical lens 167 and the optical processing unit 137 similar to the first embodiment shown in FIG. 3. The optical isolator is aligned, on the lens holder 166, to the light-emitting device 65 and aligned to the optical processing unit 137, thereby aligning the semiconductor light-emitting device 65 with the waveguide device 53 in the optical processing unit 137.

The coupling unit 135 according to the present embodiment has a pig-tailed configuration, which comprises a ferrule holder 171, a ferrule 173, a capillary 175 and an optical fiber 177. The ferrule holder 171, which is a tubular member with a bore for receiving the ferrule 173, has a side portion 171a extending along the optical axis Ax and a flange 171b at the end thereof. The end surface 171d of the flange 171b functions as a sliding surface extending in the XY-plane. As described later, the coupling unit 135 may be aligned with the waveguide device 53 in the optical processing unit 137 by sliding the housing 59 of the optical processing unit 137 on the sliding surface 171d. The ferrule 173, which may be made of metal, is slidable on the inner surface 171c of the ferrule holder 171. The ferrule 173 has a first bore 173a for receiving and securing the optical fiber 177 and a second bore 173b, continuously extending from the first bore 173a, for receiving the capillary 175. The capillary may be made of ceramic such as zirconia, resin or metal.

In the coupling unit 135 thus configured, the ferrule 173 may slide in the ferrule holder 171 along in the direction parallel to the optical axis Ax. Moreover, one of the housing 59 of the optical processing unit 137 and the coupling unit 135 may be aligned with each other in the XY-plane. Accordingly, the optical fiber 177 secured in the ferrule 173 may be optical coupled with the waveguide device 53 via the ferrule 173, the ferrule holder 171 and the housing 59.

(Third Embodiment)

Next, a method for manufacturing the optical module of the present invention will be described as referring to drawings from FIG. 7 to FIG. 12.

Figure 7A:
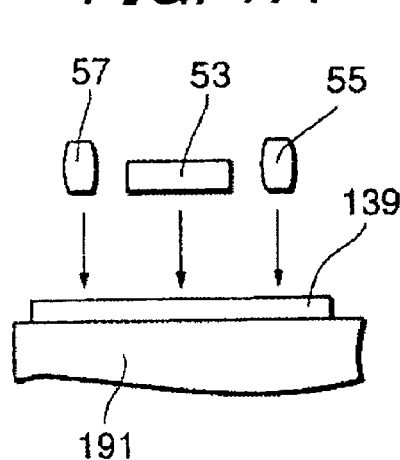
Figure 7B:
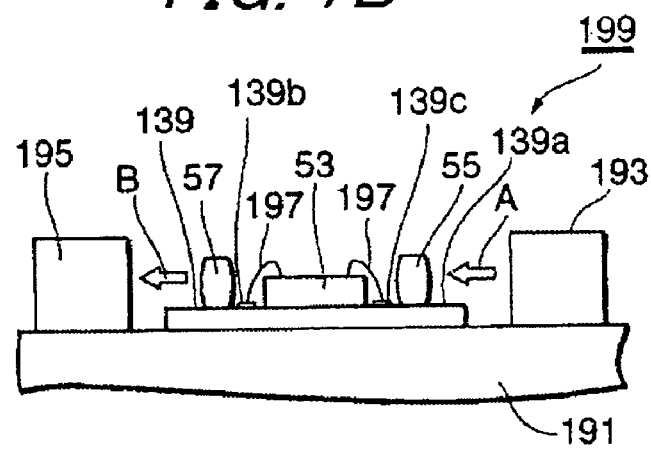

From FIG. 7A to FIG. 7D show steps for forming the optical processing unit 137. The waveguide device 53, the first and second lenses 55 and 57, and the bench 139 are prepared in this step. The bench 139 is placed on the testing stage 191 for assembling. Relative position between the waveguide device 53 and two lenses 55, 57 may be defined by the active alignment technique using the testing light beam. FIG. 7B shows the step of the active alignment, in which the light source 193 practically emits light, and the optical power meter 195 monitors the light passing through two lenses 55 and 57, and the waveguide device 53. The light source 193 and the optical power meter 195 are placed on the testing stage 191. In the case that the bench 139 has the type shown in FIG. 5C, the passive alignment technique may be applicable.

Figure 7C:
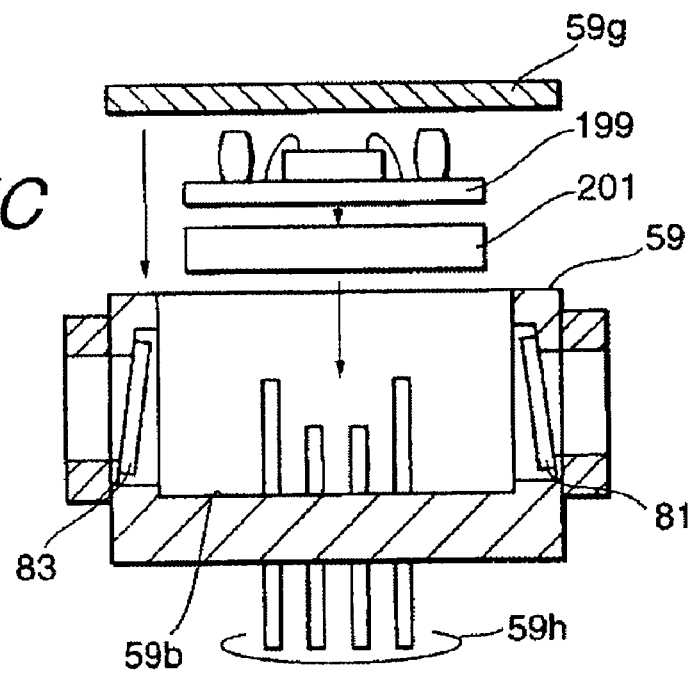

After positioning the waveguide device 53, and two lenses 55 and 57 relatively to each other, the waveguide sub-assembly 199 is installed on the bottom 59b of the housing 59. Referring to FIG. 7C, the waveguide sub-assembly 199 is mounted on the thermoelectric device 201, and the thermoelectric device 201 is installed on the bottom 59b of the housing 59. The first lens 55 in the waveguide sub-assembly 199 faces the first window 81, while the second lens 57 faces the second window 83 in the housing 59.

Figure 7D:
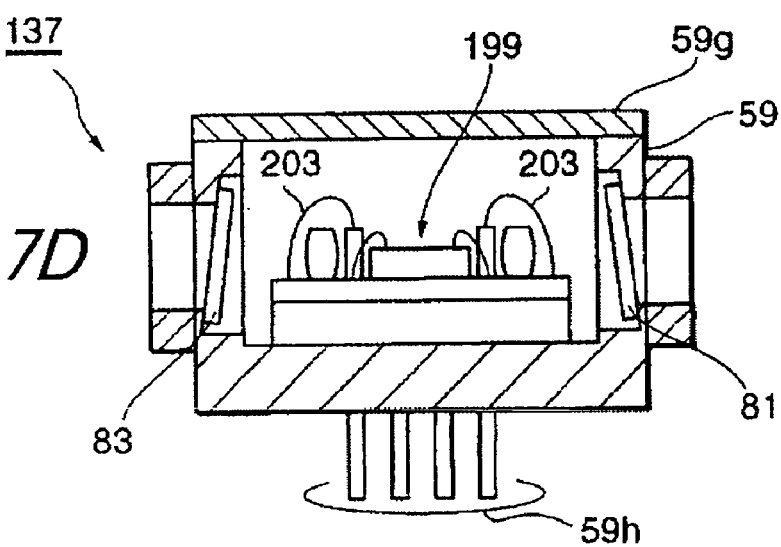

After installing the waveguide sub-assembly 199, the thermoelectric device 201 and the waveguide device 53 are connected to respective lead pins 59h with bonding-wires 203. Placing the ceiling 59g on the sides 59c to 59f and sealing airtightly the housing, as shown in FIG. 7D, the optical processing unit 137 is thus completed.

Next, the steps for manufacturing the OSA unit will be described as referring to FIGS. from 8A to 8D. The semiconductor light-emitting device 65, the stem 163, the cover 165, and the semiconductor light-receiving device 89 are prepared in FIG. 8A. The semiconductor light-emitting device 65 is to be mounted on the beat sink 160, and the assembly of the light-emitting device 65 and the heat sink 160 is installed on the sub-mount 163b, which extrudes from the stem 163. That is, the sub-mount has a primary surface 163c perpendicular to the surface 163a of the stem 163, and the semiconductor light-emitting device 65, with the heat sink 160, is mounted on the primary surface 163c. The light-receiving device 89 is mounted in the hollow formed on the stem 163. After mounting, the devices are connected with bonding wires 209a, 209b to corresponding lead pins 163d.

Figure 8A:
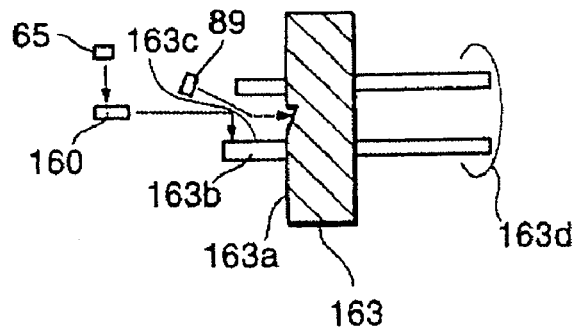
Figure 8B:
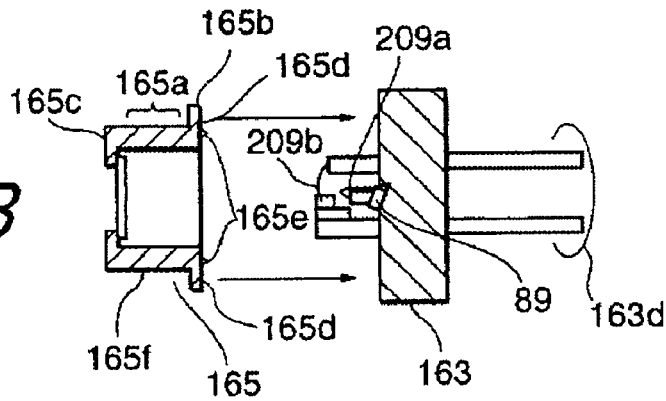
Figure 8C:
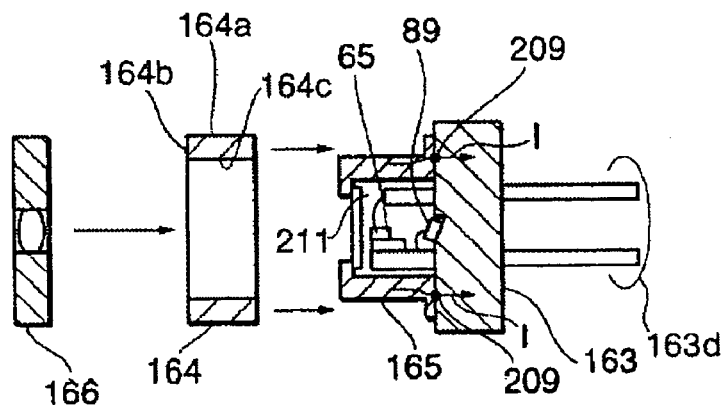
Figure 8D:
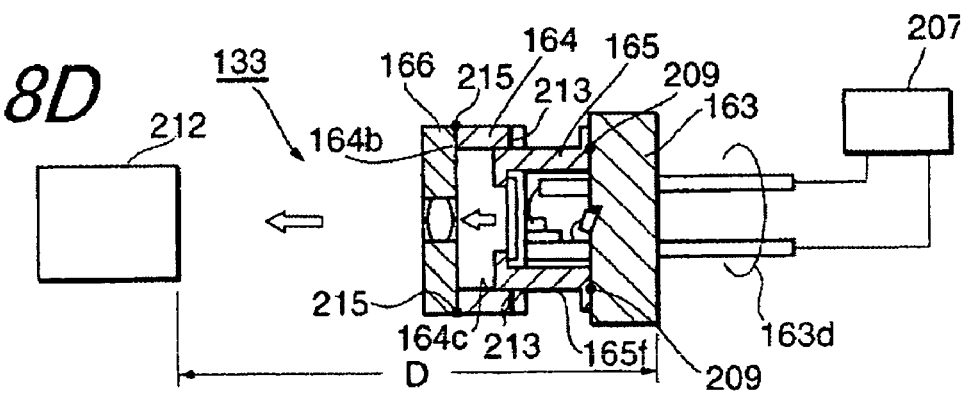

As shown in FIG. 8B and FIG. 8C, the cover 165 is to be disposed and fixed on the surface 163a of the stem 163. The cover 165 has a flange with a ring-shaped projection 165e. Setting the cover 165 on the surface of the stem 163, a quite large current is to be applied therebetween. The current will concentrate on the tip of the ring-shaped projection, thereby melting them. Thus, the cover 165 and the stem are welded together forming the cavity 211 within which the semiconductor devices 65 and 89 are air-tightly sealed.

The alignment member 164 and the lens holder 166 are to be fixed to the cover 165. As shown in FIG. 8C, the alignment member 164 is slidable on the outer surface of the cover 165. Accordingly, the optical alignment along the optical axis can be performed. The lens holder 166 is to be placed on the alignment member 164. The lens holder 166 is slidable on the surface 164b in the XY-plane, thereby enabling the optical alignment of the lens in the XY-plane.

In the alignment process aforesaid, a bias supply 207 is connected to the lead pins 163, and the light-emitting device 65 is practically biased and emits light. On the other hand, an optical power meter 212 is set apart from the OSA unit 133 by a length D for monitoring the light emitted from the light-emitting device through the alignment member 164 and the lens holder 166. After the alignment, the cover 165 and the alignment member 164 are welded by YAG laser at the side portion 213 thereof. Further, the alignment member 164 and the lens holder are welded at peripheral portions 215. Thus, the OSA unit 133 can be completed.

The optical isolator may be disposed between the OSA unit 133 and the optical processing unit 137. FIG. 9A and FIG. 9B show the process in which the optical isolator 77 is aligned and fixed to the OSA unit 133. The optical isolator 77 is disposed on the OSA unit 133 and the optical power meter 221 receives the light L emitted from the light-emitting device and passed thorough the isolator 77. Sliding and rotating the isolator 77 on the one surface 166b of the lens holder 166, the optimal position and the rotation angle of the isolator 77 can be determined where the monitored optical power is the maximum. After the alignment, the isolator 77 is permanently fixed to the OSA unit 133 at peripheral positions 215 by the YAG-laser welding.

FIG. 10A and FIG. 10B show the optical alignment of the OSA unit 133 and the optical processing unit 137. The OSA unit 133 practically emits light L1 by supplying a bias current from the power supply 225. The waveguide device 53 receives the light L2 transmitting through the lens holder 166 and the window 81, and generates the light L3 by supplying the bias from another power supply 227 provided outside of the optical processing unit 137. The optical power meter 223 receives the light L4 transmitting through the window 83.

As shown in FIG. 10A, the OSA unit 133 is able to slide M in the XY-plane and rotate R around the optical axis, which enables to align optically the OSA unit 133 with the optical processing unit 137. After the alignment, the OSA unit 133 is welded to the optical processing unit 137 at peripheral portions 229 by the YAG-laser.

Another method for manufacturing the OSA unit 133 may be considered. In the aforesaid method, first, the lens holder 166 is fixed to the cover, and the isolator 77 is subsequently assembled against the lens holder 166. In the modified method, the isolator 77 and the lens holder 166 are integrated first, next the optical processing unit 137, the package 153 of the OSA unit 133, and the lens holder 166 integrated with the isolator are aligned with respect to each other.

According to the modified method, the isolator 77 with the lens holder 166 is disposed in contact with the optical processing unit 137, and the alignment member 133 is disposed in contact with the lens holder 166. The package 153 is inserted in the alignment member 164.

The light-emitting device 65 in the package 153 inherently has an optical polarization, which is typically parallel to the primary surface 163c of the sub-mount 163b. The rotation of the isolator 77 is necessary to match the polarization direction with that of the light-emitting device 65. Therefore, an identification or marking is preferably provided on the outer surface of the isolator 77 and also the package 153, which assists rough adjustment of the rotational angle of the isolator 77. Then, the isolator 77 integrated with the lens holder 166 is finely rotated around the optical axis so as to get the maximum optical power.

Next, the isolator 77 with the lens holder 166 is aligned in the XY-plane, and the alignment member 133 is aligned in three directions X, Y and Z, and the angle θ. This procedure of the alignment is generally called as the three-body alignment. In detail, the following sequential steps is performed at least one time, if necessary, the steps are iterated until the predetermined optical coupling is realized. Namely, (1) the alignment in all directions and rotation of the package 153, and (2) sliding the optical isolator 77 with the lens holder 166 in the XY-plane. After these two alignments, the optical power received by the power meter 223 becomes the maximum.

Next, the isolator 77 is fixed to the optical processing unit 137. Although some displacement may occur at the fixing, it may be compensated by the subsequent fine alignment of three directions along X, Y and Z with package 153. Next, the alignment member 133 is fixed to the package 153. Although some displacement may occur at this fixing, too, the next alignment between the package 153 and the lens holder 166 in the XY-plane may correct the displacement.)

The method for integrating the OSA unit 133 and the optical processing unit 137 thus described may provide relatively higher optical coupling therebetween.

The another isolator 107 may be disposed between the optical processing unit 137 and the coupling unit 67. FIG. 11A shows the step for fixing the other isolator 107 to the optical processing unit 137. As shown in FIG. 11A, the other isolator 107 is slid and rotated on the end of the optical processing unit 137, here the OSA unit 133 is assembled thereto in advance. In detail, the OAS unit 133 and the optical processing unit 137 are activated by supplying the bias from the power supply 232. The optical power meter 233 is disposed apart from the other isolator 107 and monitors the light emitted from the optical processing unit 137. By sliding the isolator 107 on the end face and rotating R around the optical axis of the optical processing unit 137, and determining the position where the magnitude of the monitored light by the power meter 233 becomes the maximum, the other optical isolator 107 is optimally aligned to the optical processing unit 137. After the alignment, the other isolator 107 is permanently fixed to the optical processing unit 137 at portions 235 by the YAG laser welding.

FIG. 11B shows the step of the optical alignment between the optical processing unit 137 and the coupling unit 67. In the present step, the optical processing unit 137 with the other isolator 107 and the OSA 133 are integrated in advance. Further, the sleeve cover 91, the sleeve 93, the stub 95, and the bush 99 are also integrated in advance. The lens holder 105 is fixed to the isolator 107 such that the one plane 105a thereof faces to the isolator 107. The alignment along the optical axis may be performed between the outer side surface 99a of the bush 99 and the inner surface 101c of the alignment member 101, namely, by sliding the bush 99 on the inner surface 101c of the alignment member 101. On the other hand, the alignment in the XY-plane may be carried out between the end surface 101b of the alignment member 101 and the other end surface 105b of the lens holder 105. That is, sliding the alignment member 101 with the receptacle sub-assembly on the end surface 105b of the lens holder, the optical position in the XY-plane can be determined.

In the alignment of the coupling unit 67 thus described, the optical power meter 233 detects the light L practically emitted from the optical processing unit 137. In detail, a ferrule attached to the tip of the supplemental fiber is inserted into the split sleeve 93 and abutted to the stub 95. The optical power meter 233 is provided in the other end of the supplemental optical fiber and detects the magnitude of the light emitted from the optical processing unit, transmitted through the coupling unit 67 and propagated in the supplemental optical fiber. The lens 105 may be omitted when the second lens 57 in the optical processing unit 137 can converge light from the waveguide device 53 on the tip of the coupling fiber 97 secured in the center of the stub 95.

FIG. 12 shows the completed optical module 243 thus manufactured. The lens holder 105 and the optical isolator 107 are welded at peripheral portions 237, the lens holder 105 and the alignment member 103 are welded at portions 239, and the bush 99 and the alignment member 101 are welded at portions 241 by the YAG laser, respectively. In the optical module 243, the optical alignment between the waveguide device and the light-emitting device can be simplified.

Fourth Embodiment

FIG. 13 is a schematic exploded view of an another optical module 231 according to the fourth embodiment of the present invention. The optical module 231 comprises the OSA unit 401, the coupling unit 403, and the optical processing unit 402. The OSA unit of the present embodiment includes a receiving optical sub-assembly (ROSA), while the optical processing unit 402 includes a semiconductor optical amplifier (SOA) 253. The present optical module 231 receives light, transmitted through the coupling unit 403 and amplified by the SOA 253 installed in the optical processing unit 402, by the light-receiving device, typically a photodiode, installed in the ROSA.

The OSA unit 401 comprises the alignment member 364 and the ROSA that includes the light-receiving device 265, the sub-mount 360, and the package 353. The package 353, similar to the TOSA in the preceding embodiment, comprises the stem, the light-receiving device 265 is mounted thereon via the sub-mount 360, and the cover 365. A pre-amplifier may be installed in the package 353 for amplifying an electrical signal converted by the light-receiving device 265. The alignment member 364 aligns the ROSA 355 along the optical axis Ax and in the XY-plane perpendicular to the optical axis Ax.

The OSA unit 401 may further comprise the lens holder 367 and the optical isolator between the optical processing unit 237 and the alignment member 364. In FIG. 13, three types 355a, 355b, and 355c of OSA are shown.

In the first type 355a, the lens 367a is provided in the cover 365 and the alignment member 364 covers the almost whole side surface of the cover 365. In this arrangement, the length between the lens 367a and the light-receiving device 265 is fixed.

The cover of the second type 335b only provides the window on the top thereof, the lens holder 367 is disposed outside the package 353. The alignment member 364 has a tubular shape having a bore and overlays the side of the cover 365. The lens holder 367 having the lens 367a in the center thereof seals the one end of the alignment member 364. To adjust the position of the ROSA 355 along the optical axis Ax by sliding the alignment member 364 on the outer surface of the cover 365 is equivalently to adjust the length between the lens 367a and the light-receiving device 265. By setting the light-receiving device 265 on the focus of the lens, the maximum coupling efficiency can be obtained.

The third type of the ROSA 355c only provides the alignment member 364 with a tubular shape between the optical processing unit 402 and the ROSA 355c. In this arrangement, the convergence of the light to the light-receiving device 265 is solely carried out by the first lens 255 provided in the optical processing unit 402.

The optical processing unit 402 includes the SOA 253, the first and second lenses 255 and 257, the bench 399, the thermoelectric device (TEC) 401 and the housing 259. The SOA 253, and the first and second lenses 255 and 257 are mounted on the TEC 401 via the bench 399. The housing 259 encloses these devices and provides the first and second windows 281 and 283 to hermetically seal these devices from the outside. The first and second windows 281 and 283 are inclined to the optical axis.

The SOA 253 includes a waveguide, formed on the semiconductor substrate such as Indium Phosphide, having a light incident end and a light outgoing end. The second lens 257 is disposed so as to face the light incident end, while the first lens 255 is placed so as to face the light outgoing end. The SOA 253 further provides two electrodes, by supplying a bias therebetween, the light incident from the light incident end is amplified and output from the light outgoing end of the waveguide.

The coupling unit 403 comprises the receptacle sub-assembly 290 and the alignment member 301. In FIG. 13, a pig-tailed sub-assembly 370 is drawn addition to the receptacle sub-assembly. Configurations of respective sub-assemblies are same as those shown in FIG. 3 and FIG. 6 and corresponding description in the specification.

The coupling unit 403 may comprises, addition to the receptacle sub-assembly 290, the lens holder 305 and the optical isolator. The subsequent description will be based on the receptacle sub-assembly 290, however the similar explanation can be applied to the pig-tailed sub-assembly. The lens 305a in the lens holder 305 converts the divergent light emitted from the coupling fiber 297 into the substantially collimated light. In the present embodiment, the collimated light may be focused, by the second lens 257 in the optical processing unit 402, on the light incident end of the SOA 253.

The coupling unit may further provide the isolator. The SOA 253 is sensitive to disturbed light. Although the light incident end and the light outgoing end of the SOA 253 are coated with an AR film, nevertheless, it is quite hard to realize the complete no reflection. Moreover, a plurality of optical connectors, which brings the optical discontinuity and the optical reflection, is disposed in the optical transmission line. The optical reflection may occur at the light-receiving surface of the light-receiving device 265. When the light reflected by optical connectors and the light-receiving surface enters the SOA 253 again, the reflected light operates as a noise source, which influences the noise figure of the SOA 253. Accordingly, to provide the isolator in both the front and the rear of the SOA 253 may improve the performance thereof.

The assembly of the present optical module 231 is similar to those for preceding optical module 51, 131 and 243. However, in the present module 231, first the alignment between the coupling unit 403 and the optical processing unit 402 is carried out, and next the optical processing unit 402 and the OSA unit 401 is aligned.

FIG. 14 shows the step of aligning the coupling unit 403 with the optical processing unit 402. The optical connector is inserted into the receptacle sub-assembly 290. The other end of the optical connector is guided to the optical source 212. The optical power meter 207 is set behind the first window 281 of the optical processing unit 237. The optical power meter 207 detects the light output from the coupling unit 235 and passing through the optical processing unit 237.

The alignment along the optical axis is carried out between the bush 299 and the alignment member 301, while the alignment in the XY-plane is preformed between the alignment member 301 and the lens holder 305, and also the lens holder 305 and the end of the optical processing unit 402. After the alignment, the optical processing unit and the respective components of the coupling unit 403 are welded by the YAG-laser.

FIG. 15 shows the step for aligning the optical processing unit 402 with the OSA unit 401. The optical source used in the preceding alignment between the optical processing unit 402 and the coupling unit 403 is prepared again. In the present step, the light emitted from the optical processing unit 402 is practically monitored by the ROSA 355. The alignment along the optical axis is carried out between the alignment member 364 and the cover 365 of the ROSA 355, while that in the XY-plane is done between the lens holder 367 and the optical processing unit 402. After completion of the alignment, the YAG laser welds the ROSA 355, the alignment member 346, the lens holder 367 and the optical processing unit 402.

Thus in the present invention, since the optical processing device, the waveguide modulator in the preceding embodiment and the SOA in the present embodiment, can be positioned close to the first and second lenses, the optical coupling efficiency to the optical processing device can be enhanced. The typical effective diameter of lenses used in the optical module similar to the present invention is about 0.5 mm to 1.0 mm. On the other hand, the numerical aperture N.A. of the waveguide device, such as the SOA and the waveguide modulator, is about 0.3 to 0.5. Therefore, the angle, by which the effective optical coupling to the waveguide, can be obtained becomes about 30° to 60°. To realize the effective optical coupling with the wave guide having such coupling angle is necessary to arrange the lens close to the waveguide, and the present invention provides an effective configuration for such optical coupling.

When an optical signal with a modulation speed of 40 Gbps is entered into the optical module, the minimum sensitivity at the error rate of $10^{-12}$ was −3 dBm in the convention arrangement, in which the incident optical signal was received without a SOA. On the other hand, the SOA having the optical gain of 20 dB and the noise figure (NF) of 5 dB is set before the ROSA as shown in FIG. 15, the minimum sensitivity of −15 dBm is attained.

Although the present embodiment uses the SOA in the optical processing unit as the optical processing device, another device, for example the variable optical attenuator (VAO), may be applied to the present configuration. When the photodiode receives light with a quite high intensity, the response of the photodiode becomes inferior. By inserting the VOA preceding the ROSA and attenuating the intensity of the light incident to the photodiode, the dynamic range thereof can be enhanced. This function is applicable to another type of diode such as an avalanche photodiode.

On the other hand, in a conventional module shown in FIG. 16, the light-emitting device 5 and the light-modulating device 7 are installed in single housing 3. This configuration not only reduces the working space to align devices, but also restricts the direction of the alignment. That is, the light-modulating device 7 in FIG. 16 is movable only horizontal direction X and Z. The alignment along the vertical direction Y depends on the physical dimensions of optical components. Only machining enables to align the components along the vertical direction Y According to the present optical module, The OSA unit including the light-emitting device and the optical processing unit including waveguide device can be aligned with respect to each other in all directions. Moreover, the wider range of the alignment can be provided, which makes up for the increasing of the components, namely the present optical module provides two housings and accompanying components.

The positional dispersion between the waveguide device and two lenses along the vertical direction is within 20 micron meters, which is derived from the accuracy of the thickness of the waveguide device 53 and the dimension of the lenses, can be compensated by the alignment of the TOSA 133 with respective to the modulator sub-assembly 137. Simultaneously, the alignment between the coupling unit 67 and the optical processing unit 137 can compensate the positional dispersion between the waveguide device 53 and the second lens.

The thermoelectric device is optionally installed in the optical processing unit, which depends on the required performance to the temperature. An electro-absorption device that realizes small temperature dependence has been developed. Assuming a light-transmitting module for WDM (Wavelength division multiplexing) application, temperature of the light-emitting device should be precisely controlled to stabilize the wavelength of the light emitted from the light-emitting device. In the present invention, thermoelectric device should be mounted only in the optical sub-assembly unit by using the electro-absorption device with small temperature dependency mentioned above. Thus the module with low power consumption can be realized, because the heat load by the electro-absorption device contained in the other unit is not applied to the thermoelectric device.

According to the present invention, the OSA unit and the optical processing unit can be independently sealed, and electrically and thermally tested. Electrical testing of respective sub-assemblies can be performed by supplying the bias from each lead pins provided in the OSA unit and the optical processing unit. Moreover, the testing is completed before integrating the OSA unit and the optical processing unit. Therefore, inferior unit can be removed independently, which increase the yield of the OSA unit and simultaneously decreases the cost thereof. On the other hand, in the conventional module shown in FIG. 16, since the light-emitting device and the light-modulating device are integrated on the same substrate in the housing, and the bias must be applied from the lead pins provided in the same housing, even when an inferior device is found, the module must be removed in the whole.

What is claimed is:

1. An optical module optically connected to a transmission optical fiber, said optical module comprising:
   an optical processing unit with a box shape housing, said optical processing unit installing an optical processing device, first and second lenses, and a bench, the optical processing device being selected from a group consisting of an electro-absorption modulator, a Mach-Zender modulator, and a semiconductor optical amplifier, said bench mounting said optical processing device and said first and second lenses with the optical processing device located between the first and second lenses;
   an optical sub-assembly (OSA) unit including a first alignment member, a lens, and an optical sub-assembly with a co-axial shape package independent of said box shape housing, the optical sub-assembly housing a semiconductor optical device therein, said lens optically coupling said semiconductor optical device with said optical processing device;
   a coupling unit with a co-axial shape package coupled with said transmission optical fiber, said coupling unit including a second alignment member, a lens and a lens holder for holding said lens, said lens optically coupling said optical processing device with said transmission optical fiber; and
   an optical axis connecting said transmission optical fiber to said semiconductor optical device,
   wherein said coupling unit, said optical processing unit and said optical sub-assembly unit are arranged on said optical axis in this order, and
   wherein said first alignment member optically aligns said semiconductor optical device with respect to said optical processing device through said first lens mounted on said bench in a plane perpendicular to said optical axis, and said second alignment member optically aligns said transmission optical fiber with respect to said optical processing device through said second lens on said bench in a plane perpendicular to said optical axis.

2. The optical module according to claim 1, wherein said co-axial package of said optical sub-assembly has a stem and a cover, said semiconductor optical device being mounted on said stem.

3. The optical module according to claim 2, wherein said cover includes said lens.

4. The optical module according to claim 1, wherein said optical sub-assembly unit further includes an optical isolator optically coupled with said semiconductor optical device and said optical processing device in said optical processing unit.

5. The optical module according to claim 1, wherein said coupling unit includes a receptacle sub-assembly.

6. The optical module according to claim 1, wherein said coupling unit includes a pig-tail type sub-assembly.

7. The optical module according to claim 1, wherein said coupling unit further includes an isolator optically coupled with said transmission optical fiber and said optical processing device in said optical processing unit.

8. The optical module according to claim 1, wherein said bench has first and second recesses, said first recess securing and aligning said first lens and said second recess securing and aligning said second lens, said optical processing device being mounted on said bench between said first and second lenses.

9. The optical module according to claim 1, wherein said optical processing unit further includes a thermoelectric device for mounting said bench.

10. The optical module according to claim 1, wherein said semiconductor optical device is a semiconductor laser diode and said optical sub-assembly is a transmitting optical sub-assembly containing said laser diode.

11. The optical module according to claim 1, wherein said semiconductor optical device is a semiconductor photodiode and said optical sub-assembly is a receiving optical sub-assembly containing said photodiode.

12. An optical transmitting module for emitting light modulated with an electrical modulation signal, said optical transmitting module comprising:
   an optical sub-assembly unit with a co-axial shape package including a transmitting optical sub-assembly containing a semiconductor laser diode therein, a first alignment member, and a lens, said semiconductor laser diode emitting un-modulated light;
   an optical processing unit with a box shape housing independent of said co-axial shape package, said optical processing unit including an optical modulator, first and second lenses and a bench, said optical modulator being configured to receive said electrical modulation signal, to modulate said un-modulated light emitted from said semiconductor laser diode and to output said modulated light, said bench mounting said first and second lenses and said optical modulator thereon with said optical modulator located between said first and second lenses; and
   a coupling unit with a co-axial shape package including a receptacle sub-assembly, a second alignment member, and a lens,
   wherein said lens provided in said transmitting optical sub-assembly optically couples said semiconductor laser diode with said optical modulator through said first lens in said optical processing unit and said lens provided in said coupling unit optically couples said receptacle sub-assembly with said optical modulator through said second lens in said optical processing unit, and
   wherein said first alignment member optically aligns said semiconductor laser diode with said optical modulator and said second alignment member optically aligns said receptacle sub-assembly with said optical modulator.

13. The optical transmitting module according to claim 12, wherein said optical sub-assembly unit further includes an optical isolator optically coupled with said semiconductor laser diode in said transmitting optical sub-assembly and optically coupled with said optical modulator in said optical processing unit.

14. An optical receiving module connected to a transmission optical fiber and receiving an optical signal transmitted through said transmission optical fiber, said optical receiving module comprising:
   an optical processing unit with a box shape housing including a semiconductor optical amplifier, first and second lenses and a bench, said optical amplifier amplifying said optical signal, said bench mounting said first and second lenses and said optical modulator thereon with said optical modulator located between the first and second lenses;
   an optical sub-assembly unit with a co-axial shape package independent of said box shape housing, said optical sub-assembly unit including a receiving optical sub-assembly, a first alignment member and a lens, said receiving optical sub-assembly providing a semiconductor photodiode therein for receiving said optical signal amplified by said semiconductor optical amplifier in said optical processing unit; and a coupling unit with a co-axial shape package coupled with said transmission optical fiber, said coupling unit including a receptacle sub-assembly, a second alignment member and a lens, wherein said coupling unit, said optical processing unit and said optical sub-assembly unit are optically aligned with respect to each other, wherein said first alignment member optically aligns said semiconductor photodiode with said semiconductor optical amplifier and said second alignment member optically aligns said transmission optical fiber with said semiconductor optical amplifier, and wherein said lens in said optical sub-assembly unit optically couples said semiconductor photodiode with said semiconductor optical amplifier through said first lens in said optical processing unit and said lens in said coupling unit optically couples said transmission optical fiber with said semiconductor optical amplifier through said second lens in said optical processing unit.

15. The optical receiving module according to claim 14, wherein said optical processing unit further includes a thermoelectric device for mounting said optical semiconductor amplifier.

* * * * *